United States Patent
Kim et al.

(10) Patent No.: US 9,989,798 B2
(45) Date of Patent: Jun. 5, 2018

(54) LIGHT CONTROLLING APPARATUS, METHOD OF FABRICATING THE LIGHT CONTROLLING APPARATUS AND TRANSPARENT DISPLAY DEVICE INCLUDING THE LIGHT CONTROLLING APPARATUS WITH TRANSPARENT MODE AND LIGHT SHIELDING MODE

(71) Applicant: LG Display Co., Ltd., Seoul (KR)

(72) Inventors: Ki Han Kim, Gyonggi-do (KR); Ji Young Ahn, Gyeonggi-do (KR); Moon Sun Lee, Chungcheongbuk-do (KR); Pu Reum Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 14/747,108

(22) Filed: Jun. 23, 2015

(65) Prior Publication Data

US 2015/0378189 A1    Dec. 31, 2015

(30) Foreign Application Priority Data

Jun. 27, 2014 (KR) ................. 10-2014-0079462
Jun. 27, 2014 (KR) ................. 10-2014-0079800
(Continued)

(51) Int. Cl.
*G02F 1/1334* (2006.01)
*G02F 1/1337* (2006.01)
(Continued)

(52) U.S. Cl.
CPC .......... *G02F 1/1334* (2013.01); *G02F 1/1337* (2013.01); *G02F 1/13475* (2013.01);
(Continued)

(58) Field of Classification Search
CPC combination set(s) only.
See application file for complete search history.

(56) References Cited

U.S. PATENT DOCUMENTS

| 5,296,952 | A | 3/1994 | Takatsu et al. |
| 5,978,062 | A | 11/1999 | Liang et al. |
| 6,184,959 | B1 | 2/2001 | Izumi |
| 2002/0188053 | A1 | 12/2002 | Zang et al. |
| 2003/0184692 | A1 | 10/2003 | Nagae |
| 2004/0170776 | A1 | 9/2004 | Liang et al. |

(Continued)

FOREIGN PATENT DOCUMENTS

| CN | 1389534 A | 1/2003 |
| CN | 1503034 A | 6/2004 |

(Continued)

OTHER PUBLICATIONS

Communication dated Jul. 12, 2017 from the European Patent Office in counterpart European application No. 15174102.2.
(Continued)

*Primary Examiner* — Lauren Nguyen
(74) *Attorney, Agent, or Firm* — Morgan, Lewis & Bockius LLP

(57) ABSTRACT

A light controlling apparatus, a method of fabricating the light controlling apparatus, and a transparent display device including the light controlling apparatus are disclosed, in which light may be transmitted or shielded using a polymer dispersed liquid crystal (PDLC) layer and a guest-host liquid crystal (GHLC) layer, where the guest-host liquid crystal layer includes dichroic dyes. The light controlling apparatus includes first and second substrates facing each other; a first electrode on the first substrate; a second electrode on the second substrate; and a polymer dispersed liquid crystal (PDLC) layer and a guest-host liquid crystal (GHLC) layer between the first electrode and the second electrode, wherein the PDLC layer includes first liquid crystals having droplets, and the GHLC layer includes second liquid crystals and dichroic dyes.

17 Claims, 18 Drawing Sheets

(30) Foreign Application Priority Data

Jun. 30, 2014 (KR) .................. 10-2014-0080859
Jun. 12, 2015 (KR) .................. 10-2015-0083127

(51) Int. Cl.

| | | |
|---|---|---|
| G02F 1/1347 | (2006.01) | |
| G02F 1/1333 | (2006.01) | |
| G02F 1/1335 | (2006.01) | |
| G02F 1/1339 | (2006.01) | |
| G02F 7/00 | (2006.01) | |
| H01L 27/32 | (2006.01) | |
| H01L 51/52 | (2006.01) | |
| H01L 51/56 | (2006.01) | |
| G09G 5/42 | (2006.01) | |
| G02F 1/137 | (2006.01) | |

(52) U.S. Cl.
CPC ...... *G02F 1/13725* (2013.01); *H01L 27/3232* (2013.01); *H01L 51/5268* (2013.01); *G02F 1/13394* (2013.01); *G02F 1/133377* (2013.01); *G02F 1/133502* (2013.01); *G02F 2001/13347* (2013.01); *G02F 2201/44* (2013.01); *G02F 2203/01* (2013.01); *G02F 2203/34* (2013.01); *G09G 2300/023* (2013.01); *H01L 2251/5323* (2013.01)

(56) References Cited

U.S. PATENT DOCUMENTS

| | | | |
|---|---|---|---|
| 2008/0020007 A1* | 1/2008 | Zang | A61K 8/0295 424/401 |
| 2008/0036960 A1 | 2/2008 | Ding et al. | |
| 2008/0094551 A1* | 4/2008 | Hayashi | G02F 1/13475 349/106 |
| 2008/0303982 A1* | 12/2008 | Jin | G02F 1/1335 349/69 |
| 2010/0165256 A1 | 7/2010 | Moriya et al. | |
| 2011/0261303 A1 | 10/2011 | Jang et al. | |
| 2012/0327498 A1 | 12/2012 | Arai et al. | |

FOREIGN PATENT DOCUMENTS

| | | |
|---|---|---|
| GB | 2321718 A | 8/1998 |
| JP | 2000111880 A | 4/2000 |
| KR | 20110014904 A | 2/2011 |
| WO | 2012053415 A1 | 4/2012 |

OTHER PUBLICATIONS

The First Office Action dated Dec. 26, 2017 from the State Intellectual Property Office of the People's Republic of China in related Chinese application No. 201510363238.5.

\* cited by examiner

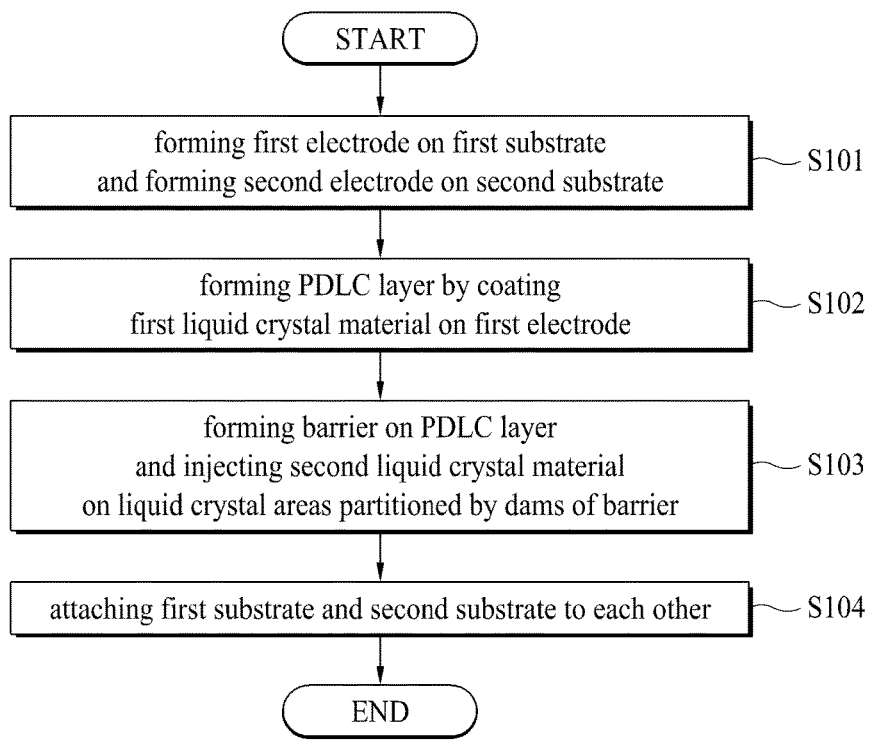

LIGHT CONTROLLING APPARATUS, METHOD OF FABRICATING THE LIGHT CONTROLLING APPARATUS AND TRANSPARENT DISPLAY DEVICE INCLUDING THE LIGHT CONTROLLING APPARATUS WITH TRANSPARENT MODE AND LIGHT SHIELDING MODE

CROSS REFERENCE TO RELATED APPLICATIONS

This application claims the benefit of the Korean Patent Application No. 10-2014-0079462 filed on Jun. 27, 2014, No. 10-2014-0079800 filed on Jun. 27, 2014, No. 10-2014-0080859 filed on Jun. 30, 2014, and No. 10-2015-0083127 filed on Jun. 12, 2015 which are hereby incorporated by reference for all purposes as if fully set forth herein.

BACKGROUND OF THE INVENTION

Field of the Invention

The present invention relates to a light controlling apparatus, and more particularly to a light controlling apparatus that may realize a transparent mode and a light-shielding mode, a method of fabricating the light controlling apparatus, and a transparent display device including the light controlling apparatus.

Discussion of the Related Art

Recently, with the advancement of the information age, display devices for processing and displaying a large amount of information have been promptly developed. More particularly, various display devices have been introduced and spotlighted.

Detailed examples of the display devices include liquid crystal display (LCD) devices, plasma display panel (PDP) devices, field emission display (FED) devices, electroluminescence display (ELD) devices, and organic electroluminescent display (OLED) devices. The display devices generally have excellent properties of a thin profile, light weight and low power consumption and thus their application fields have been increased continuously. In particular, in most of electron devices or mobile devices, the display device has been used as one of a user interface.

Also, studies of transparent display devices through which a user may see objects or images located at an opposite side have been actively made.

The transparent display devices may have advantages of better use of space, interior and design, and may have various application fields. The transparent display devices may solve spatial and temporal restrictions of electronic devices by realizing functions of information recognition, information processing and information display as a transparent electronic device. Such transparent display devices may be used for a smart window, which may be used as a window of a smart home or a smart car.

Of the transparent display devices, the transparent display device based on LCD may be realized by applying an edge type backlight thereto. However, the transparent display device to which LCD technologies are applied has a problem in that transparency is deteriorated by a polarizing plate used for realization of black. Also, a problem occurs in outdoor visibility of the transparent display device based on LCD.

The transparent display device based on OLED has power consumption higher than that of the LCD and has a difficulty in displaying a true black. Also, although the transparent display device based on OLED has no problem in a contrast ratio under a dark environment, a problem occurs in that a contrast ratio is deteriorated under a normal environment.

Therefore, to realize a transparent mode and a light shielding mode, an apparatus based on a polymer dispersed liquid crystal (PDLC) comprised of a single layer has been suggested as a light controlling apparatus of a transparent display device based on OLED. The polymer dispersed liquid crystal (PDLC) comprised of a single layer may be formed by mixing a monomer with liquid crystals, changing the monomer to a polymer through UV hardening and making the liquid crystals at a droplet state in the polymer.

If an electric field is applied to the polymer dispersed liquid crystal (PDLC), arrangement of liquid crystals arranged in the polymer is varied. Therefore, the polymer dispersed liquid crystal (PDLC) layer may scatter or transmit light which is externally incident. That is, since an apparatus based on the polymer dispersed liquid crystal (PDLC) layer may scatter or transmit light even without a polarizing plate, the apparatus may be applied to the light controlling apparatus of the transparent display device.

SUMMARY OF THE INVENTION

Accordingly, the present invention is directed to a light controlling apparatus, a method of fabricating the light controlling apparatus, and a transparent display device including the light controlling apparatus, which substantially obviate one or more problems due to limitations and disadvantages of the related art.

An object of the present invention is to provide a light controlling apparatus, a method of fabricating the light controlling apparatus, and a transparent display device including the light controlling apparatus, in which a transmittance ratio is more increased in a transparent mode by using a plurality of liquid crystal layers including a polymer dispersed liquid crystal (PDLC) layer and a guest-host liquid crystal (GHLC) layer than a case where a single PDLC layer is used, and a light shielding ratio is high in a light shielding mode.

Another object of the present invention is to provide a light controlling apparatus that may reduce the amount of dichroic dyes in a GHLC layer to increase a transmittance ratio in a transparent mode.

Another object of the present invention is to provide a light controlling apparatus in which a first alignment film and a second alignment film are attached to each other on dams of a wall in a GHLC layer.

Another object of the present invention is to provide a light controlling apparatus that may display a specific color in accordance with dichroic dyes to allow a rear background not to be seen in a light shielding mode.

Another object of the present invention is to provide a light controlling apparatus based on a plurality of liquid crystal layers that include a PDLC layer and a GHLC layer, which may reduce the cost by simplifying a fabricating process.

Another object of the present invention is to provide a transparent display device in which dams of a wall of a GHLC layer are provided in an emissive area of a transparent display panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light controlling apparatus according to one embodiment of the present invention comprises first and second substrates facing each other; a first electrode on the first substrate; a second electrode on the second substrate; and a polymer dispersed liquid crystal (PDLC) layer and a guest-host liquid crystal (GHLC) layer between the first electrode and the second electrode, wherein the PDLC layer includes first liquid crystals having droplets, and the GHLC layer includes second liquid crystals and dichroic dyes.

In another aspect, a transparent display device comprises a transparent display panel including a transmissive area and an emissive area, the emissive area having pixels displaying an image; and a light controlling apparatus on one surface of the transparent display panel, wherein the light controlling apparatus includes first and second substrates facing each other; a first electrode on the first substrate; a second electrode on the second substrate; and a plurality of liquid crystal layers including a polymer dispersed liquid crystal (PDLC) layer and a guest-host liquid crystal (GHLC) layer between the first electrode and the second electrode, the plurality of liquid crystal layers being realized in a transparent mode for transmitting incident light if no voltage is applied, and being realized in a light shielding mode for shielding incident light if a voltage is applied, and the plurality of liquid crystal layers being realized in a light shielding mode for shielding incident light in a display mode in which the pixels display an image, and being realized in a transparent mode for transmitting incident light or a light shielding mode for shielding incident light in a non-display mode in which the pixels display an image.

In other aspect, a transparent display device comprises a transparent display panel including a lower substrate and an upper substrate; and a light controlling apparatus below the lower substrate or on the upper substrate of the transparent display panel, wherein the light controlling apparatus includes a first electrode on a first substrate; a second electrode on the lower substrate or the upper substrate; and a plurality of liquid crystal layers including a polymer dispersed liquid crystal (PDLC) layer and a guest-host liquid crystal (GHLC) layer between the first electrode and the second electrode, the plurality of liquid crystal layers being realized in a transparent mode for transmitting incident light if no voltage is applied, and being realized in a light shielding mode for shielding incident light if a voltage is applied, and the plurality of liquid crystals layers being realized in a light shielding mode for shielding incident light in a display mode in which the pixels display an image, and being realized in a transparent mode for transmitting incident light or a light shielding mode for shielding incident light in a non-display mode in which the pixels display an image.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 7 is a flow chart illustrating a method of fabricating a light controlling apparatus according to one embodiment of the present invention;

DETAILED DESCRIPTION OF THE INVENTION

Figure 1:
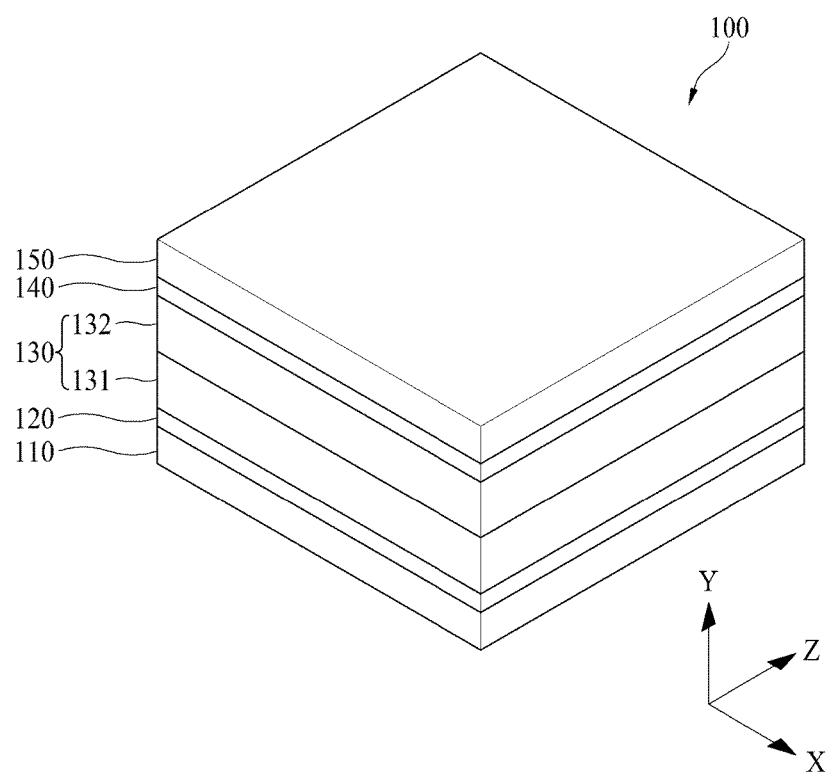
FIG. 1 is a perspective view illustrating a light controlling apparatus according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~' and 'before' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

"X-axis direction", "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the embodiments of the present invention will be described in detail with reference to the accompanying drawings.

A plurality of liquid crystal layers for use in a light controlling apparatus of a transparent display device arrange liquid crystals in a vertical direction in accordance with an alignment film to transmit incident light as it is, whereby a transparent mode is realized, and apply a voltage to scatter and absorb incident light in accordance with liquid crystals arranged in a horizontal direction and a guest material, whereby a light shielding mode is realized.

In this respect, the inventors of the present invention have invented a light controlling apparatus of a new structure through several experiments, in which a transparent mode and a light shielding mode may be realized using a plurality of liquid crystal layers. The light controlling apparatus of a new structure will be described in the following embodiments.

[Light Controlling Apparatus]

Although a transparent mode and a light shielding mode may be realized by a liquid crystal layer comprised of a single layer that does not include dyes, a light shielding mode of a white is represented by light scattering in the light shielding mode. However, the inventors of the present invention have recognized that a light shielding mode of a black not the light shielding mode of a white should be realized for a light controlling apparatus for a transparent display device in view of visibility or a contrast ratio.

Therefore, the inventors of the present invention have carried out various experiments to improve a light shielding state of a plurality of liquid crystal layers. The inventors of the present invention have tested guest-host liquid crystals (GHLC), which include dichroic dyes, to realize a light shielding mode of a black, and could have confirmed that the guest-host liquid crystals (GHLC) including dichroic dyes may realize the light shielding mode of a black through light absorption of the dyes. However, the guest-host liquid crystals (GHLC) have difficulty in scattering incident light due to absence of a polymer, whereby a light shielding ratio is low in the light shielding mode. Therefore, although the amount of the dichroic dyes has been increased to increase the light shielding ratio, a transmittance ratio is reduced due to light absorption of the dichroic dyes if the transparent mode is realized, whereby the inventors have recognized that there is a difficulty in realizing the transparent mode.

In this respect, the inventors of the present invention have recognized the aforementioned problems and have invented a light controlling apparatus of a new structure, which may increase a transmittance ratio by minimizing light absorption of dichroic dyes in a transparent mode and may realize a light shielding mode of a black having a high light shielding ratio in a light shielding mode.

A light controlling apparatus according to the embodiments of the present invention will be described in detail with reference to FIGS. 1 to 4, 5A, 5B and 6A to 6D.

Figure 2:
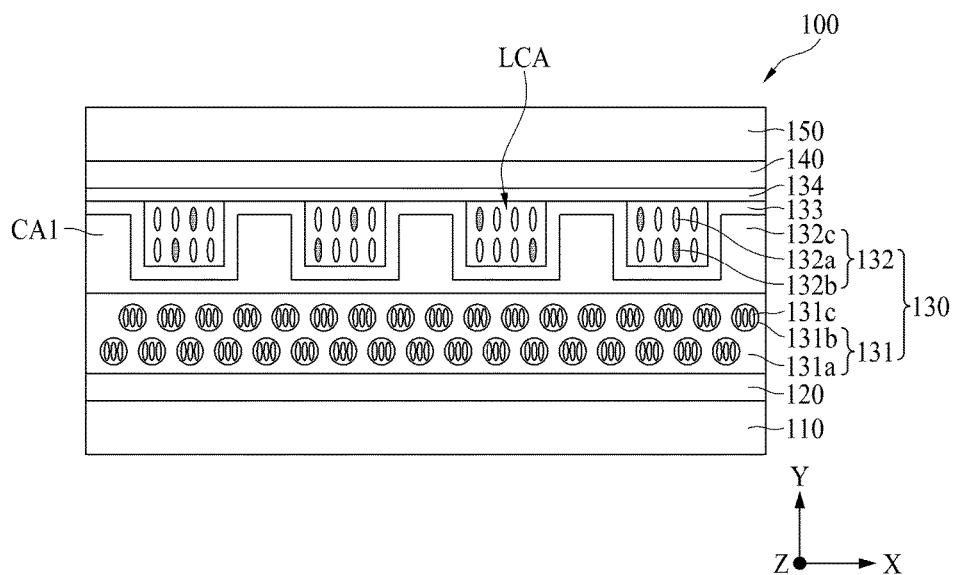
FIG. 2 is a cross-sectional view illustrating a detailed example of a light controlling apparatus of FIG. 1.

FIG. 1 is a perspective view illustrating a light controlling apparatus according to one embodiment of the present invention. FIG. 2 is a cross-sectional view illustrating a detailed example of a light controlling apparatus of FIG. 1. With reference to FIGS. 1 and 2, a light controlling apparatus 100 according to one embodiment of the present invention includes a first substrate 110, a first electrode 120, a plurality of liquid crystal layers 130, a second electrode 140, and a second substrate 150.

Each of the first substrate 110 and the second substrate 150 may be a transparent glass substrate or a plastic film. For example, each of the first substrate 110 and the second substrate 150 may be, but not limited to, a sheet or film that includes cellulose resin such as TAC (triacetyl cellulose) or DAC (diacetyl cellulose), COP (cyclo olefin polymer) such as norbornene derivatives, acryl resin such as COC (cyclo olefin copolymer) and PMMA (poly(methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The first electrode 120 is provided on the first substrate 110, and the second electrode 140 is provided on the second substrate 150. Each of the first and second electrodes 120 and 140 may be a transparent electrode. For example, each of the first and second electrodes 120 and 140 may be, but not limited to, silver oxide (AgO or $Ag_2O$ or $Ag_2O_3$), aluminum oxide (e.g., $Al_2O_3$), tungsten oxide (e.g., $WO_2$ or $WO_3$ or $W_2O_3$), magnesium oxide (e.g., MgO), molybdenum oxide (e.g., $MoO_3$), zinc oxide (e.g., ZnO), tin oxide (e.g., $SnO_2$), indium oxide (e.g., $In_2O_3$), chrome oxide (e.g., $CrO_3$ or $Cr_2O_3$), antimony oxide (e.g., $Sb_2O_3$ or $Sb_2O_5$), titanium oxide (e.g; $TiO_2$), nickel oxide (e.g., NiO), copper oxide (e.g; CuO or $Cu_2O$), vanadium oxide (e.g., $V_2O_3$ or $V_2O_5$), cobalt oxide (e.g., CoO), iron oxide (e.g.; $Fe_2O_3$ or $Fe_3O_4$), niobium oxide (e.g; $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

As shown in FIG. 1, the plurality of liquid crystal layers 130 between the first substrate 110 and the second substrate 150 may include a polymer dispersed liquid crystal layer 131 (hereinafter, referred to as "PDLC layer") and a guest-host liquid crystal layer 132 (hereinafter, referred to as "GHLC layer"). Although FIG. 1 illustrates that the plurality of liquid crystal layers 130 include the PDLC layer 131 and the GHLC layer 132 only, the plurality of liquid crystal layers 130 are not limited to the example of FIG. 1. That is, the plurality of liquid crystal layers 130 may further include at least one PDLC layer or GHLC layer in addition to the PDLC layer 131 and the GHLC layer 132. Also, the PDLC layer 131 may be replaced with a polymer network liquid crystal (PNLC) layer. However, in this case, the polymer network liquid crystal layer may include a spacer or wall.

This PDLC layer will be described with reference to FIG. 2.

As shown in FIG. 2, the GHLC layer 132 is provided on the PDLC layer 131. The PDLC layer 131 includes a polymer 131a and droplets 131b. Each of the plurality of droplets 131b may include a plurality of first liquid crystals 131c. That is, the first liquid crystals 131c may be dispersed into the plurality of droplets 131b by the polymer 131a. The first liquid crystals 131c may be, but not limited to, nematic liquid crystals of which arrangement is varied by the vertical electric field (y-axis direction) of the first and second electrodes 120 and 140. The PDLC layer 131 has a solid state in the other portion except the droplets 131b due to the polymer 131a. Therefore, the PDLC layer 131 may maintain a cell gap even without a spacer or all.

To realize a light shielding mode of a black, the GHLC layer 132 includes second liquid crystals 132a and dichroic dyes 132b. The second liquid crystals 132a may be host materials, and the dichroic dyes 132b may be guest materials. At this time, the black state of the light shielding mode may be realized by light absorption of the dichroic dyes 132b. Therefore, external light is scattered by passing through the PDLC layer 131, and the scattered external light is subjected to light absorption by the dichroic dyes 132b of the GHLC layer 132, whereby the light shielding state is realized. Also, since the light scattered by passing through the PDLC layer 131 passes through the GHLC layer 132 with a long light path, a light shielding ratio may be increased.

The second liquid crystals 132a and the dichroic dyes 132b may be, but not limited to, nematic liquid crystals of which arrangement is varied by the vertical electric field (y-axis direction electric field). The dichroic dyes 132b may be dyes that absorb light. For example, the dichromatic dyes 132b may be black dyes that absorb every light of a visible ray wavelength range or dyes that absorb light except a specific colored (for example, red) wavelength and reflect light of the specific colored (for example, red) wavelength. Preferably, in the embodiment of the present invention, the dichroic dyes 132b may be, but not limited to, black dyes to increase the light shielding ratio for shielding light. For example, the dichroic dyes 132b may be dyes that have any one color of red, green, blue and yellow or have a mixed color of red, green, blue and yellow. If the dichroic dyes 132b of the GHLC layer 132 are dyes having a red color, light that has passed through the GHLC layer 132 from the PDLC layer 131 has a red color. Therefore, if no voltage is applied, as light passes through the GHLC layer 132 from the PDLC layer 131, the light controlling apparatus 100 may display colors of the dichroic dyes 132b disposed on the GHLC layer 132. Therefore, the light controlling apparatus 100 may shield its rear background while displaying various colors not a black based color in a light shielding mode. For this reason, the light controlling apparatus 100 may provide various colors during light shielding, whereby esthetic effect may be provided to a user. For example, if the light controlling apparatus 100 is applied to a smart window or public window, which may be used at a public place and requires a transparent mode and a light shielding mode, the light controlling apparatus 100 may shield light while displaying various colors in accordance with time or place.

Also, the PDLC layer 131 may include the dichroic dyes. However, in this case, it is preferable that the amount of the dichroic dyes is included in the PDLC layer 131 in the range that a transmittance ratio of light that has passed through the PDLC layer 131 in the transparent mode is not decreased.

The dichroic dyes 132b may be, but not limited to, materials that include Aluminum Zinc Oxide (AZO). The dichroic dyes 132b may be included in the liquid crystal layer 130 in the range of 0.5 wt % to 1.5 wt % when a cell gap of the liquid crystal layer 130 is 5 μm to 15 μm. However, the dichroic dyes 132b having a content smaller than 0.5 wt % may be included in the liquid crystal layer 130 if the light shielding ratio of the light shielding mode is improved. Therefore, the amount of the dichroic dyes 132b may be reduced to reach 0.1 wt % if the light shielding ratio of the light shielding mode is improved. Alternatively, the dichroic dyes 132b having a content more than 1.5 wt % should be included in the liquid crystal layer 130 to improve the light shielding ratio if the cell gap of the liquid crystal layer 130 becomes small. Therefore, if the cell gap is smaller than 5 μm, the dichroic dyes 132b may be included in the liquid crystal layer 130 to reach 3 wt %. Meanwhile, the dichroic dyes 132b have a predetermined refractive index but their amount included in the liquid crystal layer 130 is small. Also, since the dichroic dyes 132b absorb incident light, the dichroic dyes 132b rarely refracts incident light.

Also, if the light controlling apparatus increases the amount of the dichroic dyes 132b in the liquid crystal layer 130 to increase the light shielding ratio in the light shielding mode, a transmittance ratio may be reduced. Therefore, the amount of the dichroic dyes 132b in the liquid crystal layer 130 may be adjusted considering the light shielding ratio of the light shielding mode and the transmittance ratio of the transparent mode.

Also, the dichroic dyes 132b may easily be discolored by ultraviolet rays (hereinafter, referred to as "UV"). In more detail, a polymer dispersed liquid crystal (PDLC) layer or polymer network liquid crystal (PNLC) layer, which includes the dichroic dyes 132b, essentially needs a UV process for hardening a polymer. In this case, a problem may occur in that the dichroic dyes 132b may be discolored by UV. For example, blue dichroic dyes 132b may be discolored to a purple color by the UV. In this case, since the wavelength range of light absorbed by the dichroic dyes 132b is varied, a problem may occur in that light shielding is performed by a color different from an originally intended color. Also, the dichroic dyes 132b may be damaged by UV, whereby a light absorption ratio of the dichroic dyes 132b may be reduced. As a result, the amount of the dichroic dyes 132b should be increased to prevent the light shielding ratio of the light shielding mode from being reduced, whereby the cost may be increased. Therefore, the liquid crystal layer 130 that includes the dichroic dyes 132b may be comprised so as not to need a UV process. The GHLC layer 132 has a liquid state differently from the PDLC layer 131. Therefore, the PDLC layer 131 of the solid state is not vulnerable to external pressure and may maintain a cell gap between the first substrate 110 and the second substrate 150 even without a spacer or wall, whereas the GHLC layer 132 needs a spacer or wall for resolving vulnerability to external pressure and maintaining a cell gap.

A wall 132c is formed in a concavo-convex shape, and may include dams CA1. A plurality of liquid crystal areas LCA are provided between the dams CA1 of the wall 132c. The second liquid crystals 132a and the dichroic dyes 132b are provided on the plurality of liquid crystal areas LCA between the dams CA1 of the wall 132c. The second liquid crystals 132a and the dichroic dyes 132b provided on any one of the liquid crystal areas LCA may be separated from those provided on another liquid crystal area LCA by the dams CA1. Therefore, since movement of the dichroic dyes 132b is restrictive, the light controlling apparatus may uniformly realize the light shielding mode. And, the wall 132c according to the embodiment of the present invention may maintain the cell gap between the first substrate 110 and the second substrate 150 and also maintain ratios of the second liquid crystals 132a to the dichroic dyes 132b almost similarly to one another for each of the plurality of liquid crystal areas LCA in the light controlling apparatus. For example, a difference in the ratios of the second liquid crystals 132a to the dichroic dyes 132b between the plurality of liquid crystal areas LCA may be within the range of 1%. If the difference in the ratios of the second liquid crystals 132a to the dichroic dyes 132b between the plurality of liquid crystal areas LCA is in the range greater than 1%, the transmittance ratio in the transparent mode and the light shielding ratio in the light shielding mode between the plurality of liquid crystal areas LCA may be different from each other.

The wall 132c may be, but not limited to, any one of a photo resist of a transparent material, a photo-hardening polymer and polydimethylsiloxane.

A first alignment film 133 is provided on the wall 132c, and a second alignment film 134 is provided on the second electrode 140. The second liquid crystals 132a and the dichroic dyes 132b may be arranged in a given direction by the first and second alignment films 133 and 134. For example, as shown in FIG. 2, the second liquid crystals 132a and the dichroic dyes 132b may be arranged in a vertical direction (y-axis direction).

Also, to realize the light controlling apparatus having flexibility, the first and second substrates 110 and 150 may be plastic films. In this case, the first and second substrates 110 and 150 may be damaged by a process of a high temperature. Therefore, the process of forming the first and second alignment films 133 and 134 on the first and second substrates 110 and 150 may be performed using a vertical alignment material that may be formed at a low temperature less than 200° C.

At this time, the second alignment film 134 may be attached to the first alignment film 133 which is on the dams CA1 of the wall 132c, including an adhesive material. Since the contact area between the first alignment film 133 and the second alignment film 134 becomes wider if an area of the dams CA1 of the wall 132c becomes wider, an adhesive force between the first alignment film 133 and the second alignment film 134 may be increased. Therefore, since the problem that the GHLC layer 132 is vulnerable to external pressure may be solved, the light controlling apparatus having flexibility may be provided. Also, if the first and second substrates 110 and 150 are plastic films, it is difficult to attach the first and second substrates 110 and 150 to each other by using a separate adhesive. Therefore, it is preferable to increase the contact area between the first alignment film 133 and the second alignment film 134 to increase the adhesive force between the first alignment film 133 and the second alignment film 134. However, the area of the liquid crystal areas LCA becomes narrower if the area of the dams CA1 becomes wider. At this time, since the area where the second liquid crystals 132a and the dichroic dyes 132b are provided becomes narrow, a light shielding defect may occur in the light shielding mode. Therefore, the area of the dams CA1 of the wall 132c is adjusted preferably considering the light shielding ratio and the adhesive force.

Also, the GHLC layer 132 may include a polymer network. At this time, the GHLC layer 132 may increase scattering efficiency of incident light due to the polymer network.

The light controlling apparatus 100 according to the embodiment of the present invention may be realized in a light shielding mode for shielding light and a transparent mode for transmitting light by controlling a voltage applied to each of the first and second electrodes 120 and 140. Hereinafter, the transparent mode and the light shielding mode of the light controlling apparatus will be described with reference to FIGS. 3 and 4.

Figure 3:
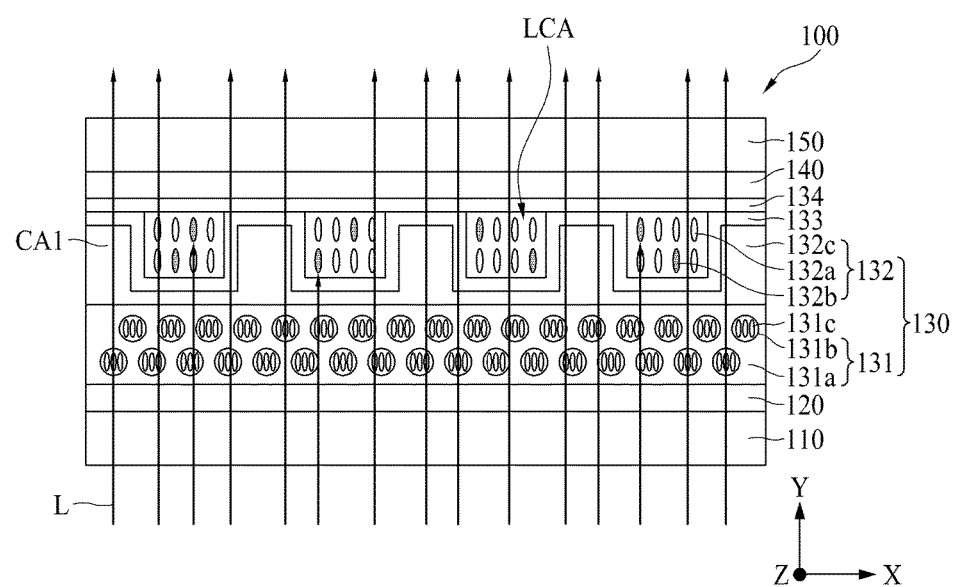
FIG. 3 is a cross-sectional view illustrating a light controlling apparatus of a transparent mode.
Figure 4:
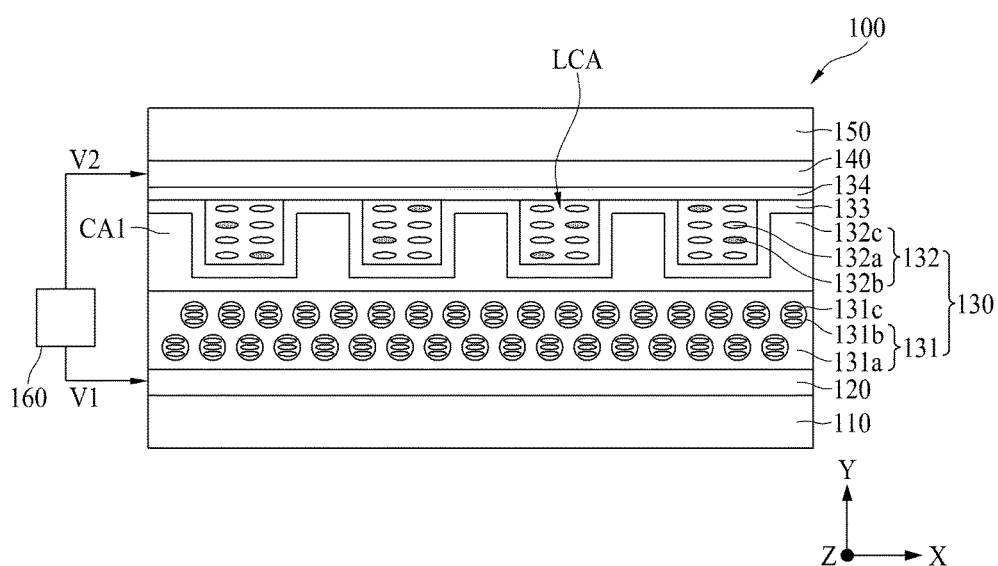
FIG. 4 is a cross-sectional view illustrating a light controlling apparatus of a light shielding mode.

FIG. 3 is a cross-sectional view illustrating a light controlling apparatus of a transparent mode, and FIG. 4 is a cross-sectional view illustrating a light controlling apparatus of a light shielding mode.

As shown in FIGS. 3 and 4, the light controlling apparatus 100 may further include a voltage supply unit 160 supplying a predetermined voltage to each of the first and second electrodes 120 and 140. The light controlling apparatus 100 may be realized in a light shielding mode shielding incident light and a transparent mode transmitting incident light by controlling arrangement of liquid crystals and dichroic dyes of a plurality of liquid crystal layers 130 in accordance with the voltage applied to the first electrode 120 and the voltage applied to the second electrode 140.

As shown in FIG. 3, if no voltage is applied, the first liquid crystals 131c of the PDLC layer 131 and the second liquid crystals 132a and the dichroic dyes 132b of the GHLC layer 132 may be arranged in a vertical direction (y-axis direction) by the first and second alignment films 133 and 134. In more detail, if no voltage is applied to the first and second electrodes 120 and 140 or a voltage difference between a first voltage applied to the first electrode 120 and a second voltage applied to the second electrode 140 is smaller than a first reference voltage, the first liquid crystals 131c of the PDLC layer 131 and the second liquid crystals 132a and the dichroic dyes 132b of the GHLC layer 132 may be arranged in a vertical direction (y-axis direction) by the first and second alignment films 133 and 134.

In this case, the first liquid crystals 131c are arranged in an incident direction of light, and a refractive index between the polymer 131a and the first liquid crystals 131c of the PDLC layer 131 is minimized, whereby scattering of light incident upon the PDLC layer 131 is minimized. Also, since the second liquid crystals 132a and the dichroic dyes 132b are also arranged in an incident direction of light, absorption of light incident upon the GHLC layer 132 is minimized. Therefore, most of light incident upon the light controlling apparatus 100 may pass through the plurality of liquid crystal layers 130.

As described with reference to FIG. 3, the embodiment of the present invention has an advantage in that power consumption is not required to realize the transparent mode as the transparent mode may be realized if no voltage is applied.

As shown in FIG. 4, if a voltage is applied, the first liquid crystals 131c of the PDLC layer 131 and the second liquid crystals 132a and the dichroic dyes 132b of the GHLC layer 132 may be arranged in a horizontal direction (x-axis or z-axis direction). In more detail, if a voltage difference between a first voltage applied to the first electrode 120 and a second voltage applied to the second electrode 140 is greater than a second reference voltage, the first liquid crystals 131c of the PDLC layer 131 and the second liquid crystals 132a and the dichroic dyes 132b of the GHLC layer 132 may be arranged in a horizontal direction (x-axis or z-axis direction). At this time, the second reference voltage may be greater than or the same as the first reference voltage.

At this time, a difference in a refractive index between the polymer 131a and the first liquid crystals 131c of the PDLC layer 131 is maximized, whereby the light incident upon the PDLC layer 131 is scattered by the first liquid crystals 131c. The light scattered by the first liquid crystals 131c is scattered by the second liquid crystals 132a of the GHLC layer 132 or absorbed by the dichroic dyes 132b. Therefore, the light controlling apparatus may shield the incident light in the light shielding mode. For example, if the dichroic dyes 132b are black dyes, the light controlling apparatus 100 may shield the incident light by displaying a black color in the light shielding mode. That is, in the embodiment of the present invention, a specific color is displayed in accordance with the dichroic dyes 132b, whereby a rear background of the light controlling apparatus may not be displayed.

In the embodiment of the present invention, it is assumed that the light shielding mode represents that a transmittance ratio of the light controlling apparatus 100 is smaller than a % while the transparent mode represents that the transmittance ratio of the light controlling apparatus 100 is greater than b %. The transmittance ratio of the light controlling apparatus 100 represents a ratio of output light to light incident upon the light controlling apparatus 100. For example, a % may be, but not limited to, 10% to 50%, and b % may be, but not limited to, 60% to 90%. In this case, if no voltage is applied to the first and second electrodes 120 and 140, or if the voltage difference between the first voltage V1 applied to the first electrode 120 and the second voltage V2 applied to the second electrode 140 is smaller than the first reference voltage, the light controlling apparatus 100 is realized in the light shielding mode in which the transmittance ratio is smaller than a %. If the voltage difference between the first voltage V1 applied to the first electrode 120 and the second voltage V2 applied to the second electrode 140 is greater than the second reference voltage, the light controlling apparatus 100 is realized in the transparent mode in which the transmittance ratio is greater than b %. If the voltage difference between the first voltage V1 applied to the first electrode 120 and the second voltage V2 applied to the second electrode 140 is more than the first reference voltage and less than the second reference voltage, the transmittance ratio of the light controlling apparatus 100 is neither smaller than a % nor greater than b %, whereby both the transparent mode and the light shielding mode of the present invention are not satisfied.

Meanwhile, although the second reference voltage may be greater than the first reference voltage, the second reference voltage may be substantially the same as the first reference voltage. In this case, a reference transmittance ratio of the light shielding mode and a reference transmittance ratio of the transparent mode may be c % equally. For example, if the voltage difference between the first voltage V1 applied to the first electrode 120 and the second voltage V2 applied to the second electrode 140 is smaller than the reference voltage, the light controlling apparatus 100 is realized in the light shielding mode in which the transmittance ratio is smaller than c %. If the voltage difference between the first voltage V1 applied to the first electrode 120 and the second voltage V2 applied to the second electrode 140 is more than the reference voltage, the light controlling apparatus 100 is realized in the transparent mode in which the transmittance ratio is equal to or greater than c %. For example, c % may be 10% to 50%.

As described with reference to FIGS. 3 and 4, in the embodiment of the present invention, the PDLC layer 131 that includes the first liquid crystals 131c transmits light in the transparent mode and scatters light in the light shielding mode while the GHLC layer 132 that includes the second liquid crystals 132a and the dichroic dyes 132b transmits light in the transparent mode and scatters light in the light shielding mode, whereby light may be transmitted in the transparent mode, and may be shielded in the light shielding mode.

Meanwhile, if the light controlling apparatus includes a single liquid crystal layer that includes dichroic dyes, for example, if a single liquid crystal layer is the GHLC layer, it is difficult to realize scattering due to absence of a polymer. Therefore, a problem occurs in that the light shielding ratio is reduced in the light shielding mode. At this time, to increase the light shielding ratio, more dichroic dyes should be included in the single liquid crystal layer, for example, the GHLC layer to absorb light. However, if more dichroic dyes are included in the single liquid crystal layer, a problem occurs in that the transmittance ratio of the light controlling apparatus 100 is reduced in the transparent mode due to light absorption of the dichroic dyes.

In case of the light controlling apparatus 100 according to the embodiment of the present invention, the light incident upon the PDLC layer 131 as shown in FIG. 4 is scattered by the first liquid crystals 131c in the light shielding mode, whereby a light path becomes long. In case of the light controlling apparatus 100 according to the embodiment of the present invention, since the light of which path becomes long is incident upon the GHLC layer 132, it is likely that the light incident upon the GHLC layer 132 is scattered by the second liquid crystals 132a or absorbed by the dichroic dyes 132b. That is, if the light controlling apparatus 100 includes a plurality of liquid crystal layers such as the PDLC layer 131 and the GHLC layer 132, light absorption is increased by the dichroic dyes 132b, whereby the light shielding ratio may be increased.

Meanwhile, since the dichroic dyes 132b of the GHLC layer 132 absorb light in the transparent mode, it is preferable that the amount of the dichroic dyes 132b is reduced to increase the transmittance ratio. Therefore, when the light controlling apparatus includes the PDLC layer 131 and the GHLC layer 132 instead of a single GHLC Layer, the amount of the dichroic dyes 132b may be reduced and the light shielding ratio may be increased. Therefore, light absorption of the dichroic dyes 132b may be minimized in the transparent mode, whereby the transmittance ratio may be increased. In the embodiment of the present invention, since the light controlling apparatus includes the PDLC layer 131 and the GHLC layer 132, the light shielding ratio may be more increased in the light shielding mode and at the same time the transmittance ratio may be more increased in the transparent mode than the case where the light controlling apparatus includes a single GHLC layer.

Figure 5A:
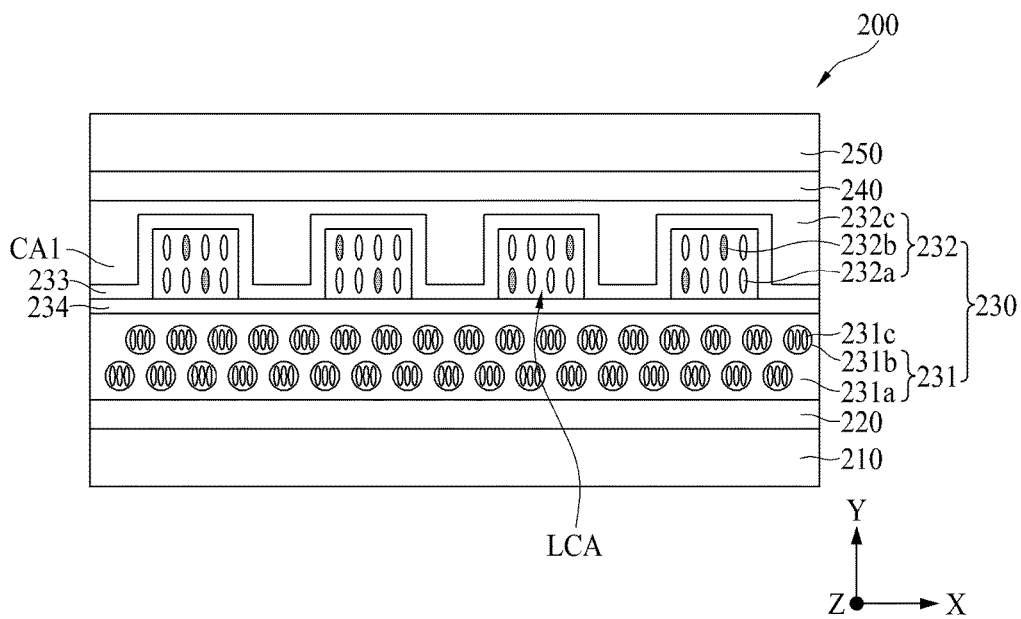
FIGS. 5A and 5B are cross-sectional views illustrating other detailed examples of a light controlling apparatus.

FIG. 5A is a cross-sectional view illustrating another detailed example of a light controlling apparatus of FIG. 1. As shown in FIG. 5A, a light controlling apparatus 200 according to the embodiment of the present invention includes a first substrate 210, a first electrode 220, a PDLC layer 231, a GHLC layer 232, a second electrode 240, and a second substrate 250.

The first substrate 210, the first electrode 220, the PDLC layer 231, the second electrode 240, and the second substrate 250 of FIG. 5A are substantially the same as the first substrate 110, the first electrode 120, the PDLC layer 131, the second electrode 140, and the second substrate 150, which are described with reference to FIGS. 1 and 2. Therefore, a detailed description of the first substrate 210, the first electrode 220, the PDLC layer 231, the second electrode 240, and the second substrate 250 of FIG. 5A will be omitted.

The GHLC layer 232 is provided on the second electrode 240. The GHLC layer 232 includes second liquid crystals 232a and dichroic dyes 232b. The second liquid crystals 232a and the dichroic dyes 232b of FIG. 5A are substantially the same the second liquid crystals 132a and the dichroic dyes 132b described with reference to FIGS. 1 and 2. Therefore, a detailed description of the second liquid crystals 232a and the dichroic dyes 232b of FIG. 5A will be omitted.

The GHLC layer 232 has a liquid state differently from the PDLC layer 231. Therefore, the GHLC layer 232 needs a spacer or wall for maintaining a cell gap.

A wall 232c is formed in a concavo-convex shape, and may include dams CA1. A plurality of liquid crystal areas LCA are provided between the dams CA1 of the wall 232c. The second liquid crystals 232a and the dichroic dyes 232b are provided on the plurality of liquid crystal areas LCA between the dams CA1 of the wall 232c. Therefore, the second liquid crystals 232a and the dichroic dyes 232b provided on any one of the liquid crystal areas LCA may be separated from those provided on another liquid crystal area LCA by the dam CA1. Therefore, in the embodiment of the present invention, ratios of the second liquid crystals 232a to the dichroic dyes 232b may be maintained almost similarly to one another for each of the plurality of liquid crystal areas LCA. That is, in the embodiment of the present invention, the ratios of the second liquid crystals 232a to the dichroic dyes 232b may be maintained uniformly in the light controlling apparatus 200. For example, a difference in the ratios of the second liquid crystals 232a to the dichroic dyes 232b between the plurality of liquid crystal areas LCA may be within the range of 1%. If the difference in the ratios of the second liquid crystals 232a to the dichroic dyes 232b between the plurality of liquid crystal areas LCA is in the range greater than 1%, the transmittance ratio in the transparent mode and the light shielding ratio in the light shielding mode between the plurality of liquid crystal areas LCA may be different from each other. The walls 232c may be, but not limited to, any one of a photo resist of a transparent material, a photo-hardening polymer, and polydimethylsiloxane.

A first alignment film 233 is provided on the wall 232c, and a second alignment film 234 is provided on the PDLC layer 231. The second liquid crystals 232a and the dichroic dyes 232b may be arranged in a given direction by the first and second alignment films 233 and 234. For example, as shown in FIG. 5A, the second liquid crystals 232a and the dichroic dyes 232b may be arranged in a vertical direction (y-axis direction). Also, the second alignment film 234 may be attached to the first alignment film 233 which is on the dams CA1 of the wall 232c, including an adhesive material. At this time, since the contact area between the first alignment film 233 and the second alignment film 234 becomes wider if an area of the dams CA1 of the wall 232c becomes wider, an adhesive force between the first alignment film 233 and the second alignment film 234 may be increased. If the first and second substrates 210 and 250 are plastic films, it is difficult to attach the first and second substrates 210 and 250 to each other by using an adhesive. Therefore, it is preferable to increase the contact area between the first alignment film 233 and the second alignment film 234 to increase the adhesive force between the first alignment film 233 and the second alignment film 234. However, the area of the liquid crystal areas LCA becomes narrower if the area of the dams CA1 becomes wider. In this case, since the area where the second liquid crystals 232a and the dichroic dyes 232b are provided becomes narrow, a light shielding defect may occur in the light shielding mode. Therefore, the area of the dams CA1 of the wall 232c may be adjusted appropriately considering the light shielding ratio and the adhesive force.

Also, the GHLC layer 232 may include a polymer network. At this time, the GHLC layer 232 may increase scattering efficiency of incident light due to the polymer network.

The light controlling apparatus 200 according to the embodiment of the present invention as shown in FIG. 5A may be realized in a light shielding mode for shielding light and a transparent mode for transmitting light by controlling a voltage applied to each of the first and second electrodes 220 and 240. The transparent mode and the light shielding mode of the light controlling apparatus 200 shown in FIG. 5A are substantially the same as those described with reference to FIGS. 3 and 4.

Figure 5B:
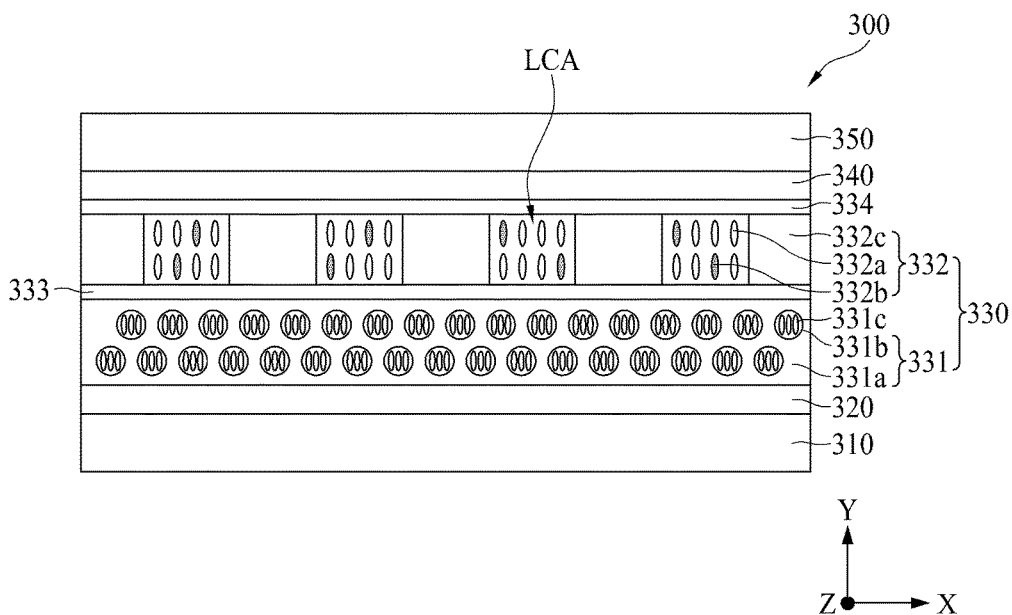

FIG. 5B is a cross-sectional view illustrating still another detailed example of a light controlling apparatus of FIG. 1.

As shown in FIG. 5B, a light controlling apparatus 300 according to the embodiment of the present invention includes a first substrate 310, a first electrode 320, a PDLC layer 331, a GHLC layer 332, a second electrode 340, and a second substrate 350.

The first substrate 310, the first electrode 320, the PDLC layer 331, the second electrode 340, and the second substrate 350 of FIG. 5B are substantially the same as the first substrate 110, the first electrode 120, the PDLC layer 131, the second electrode 140, and the second substrate 150, which are described with reference to FIGS. 1 and 2. Therefore, a detailed description of the first substrate 310, the first electrode 320, the PDLC layer 331, the second electrode 340, and the second substrate 350 of FIG. 5B will be omitted.

The GHLC layer 332 is provided on the PDLC layer 331. The GHLC layer 332 includes second liquid crystals 332a and dichroic dyes 332b. The second liquid crystals 332a and the dichroic dyes 332b of FIG. 5B are substantially the same the second liquid crystals 132a and the dichroic dyes 132b described with reference to FIGS. 1 and 2. Therefore, a detailed description of the second liquid crystals 332a and the dichroic dyes 332b of FIG. 5B will be omitted.

The GHLC layer 332 has a liquid state differently from the PDLC layer 331. Therefore, the GHLC layer 332 needs a spacer or wall for maintaining a cell gap. A wall 332c may be, but not limited to, any one of a photo resist of a transparent material, a photo-hardening polymer, and polydimethylsiloxane.

The second liquid crystals 332a and the dichroic dyes 332b are provided on a plurality of liquid crystal areas LCA between dams CA1 of the wall 332c. Therefore, the second liquid crystals 332a and the dichroic dyes 332b provided on any one of the liquid crystal areas LCA may be separated from those provided on another liquid crystal area LCA by the dam CA1. Therefore, in the embodiment of the present invention, ratios of the second liquid crystals 332a to the dichroic dyes 332b may be maintained almost similarly to one another for each of the plurality of liquid crystal areas LCA. That is, in the embodiment of the present invention, the ratios of the second liquid crystals 332a to the dichroic dyes 332b may be maintained uniformly in the light controlling apparatus 300. For example, a difference in the ratios of the second liquid crystals 332a to the dichroic dyes 332b between the plurality of liquid crystal areas LCA may be within the range of 1%. If the difference in the ratios of the second liquid crystals 332a to the dichroic dyes 332b between the plurality of liquid crystal areas LCA is in the range greater than 1%, the transmittance ratio in the transparent mode and the light shielding ratio in the light shielding mode between the plurality of liquid crystal areas LCA may be different from each other.

A first alignment film 333 is provided on the PDLC layer 331, and a second alignment film 334 is provided on the GHLC layer 332. The second liquid crystals 332a and the dichroic dyes 332b may be arranged in a given direction by the first and second alignment films 333 and 334. For example, as shown in FIG. 5B, the second liquid crystals 332a and the dichroic dyes 332b may be arranged in a vertical direction (y-axis direction). Also, the wall 332c may be hardened by UV irradiation and then stuck to the first and second alignment films 333 and 334.

The light controlling apparatus 300 according to the embodiment of the present invention as shown in FIG. 5B may be realized in a light shielding mode for shielding light and a transparent mode for transmitting light by controlling a voltage applied to each of the first and second electrodes 320 and 340. The transparent mode and the light shielding mode of the light controlling apparatus 300 shown in FIG. 5B are substantially the same as those described with reference to FIGS. 3 and 4.

Figure 6A:
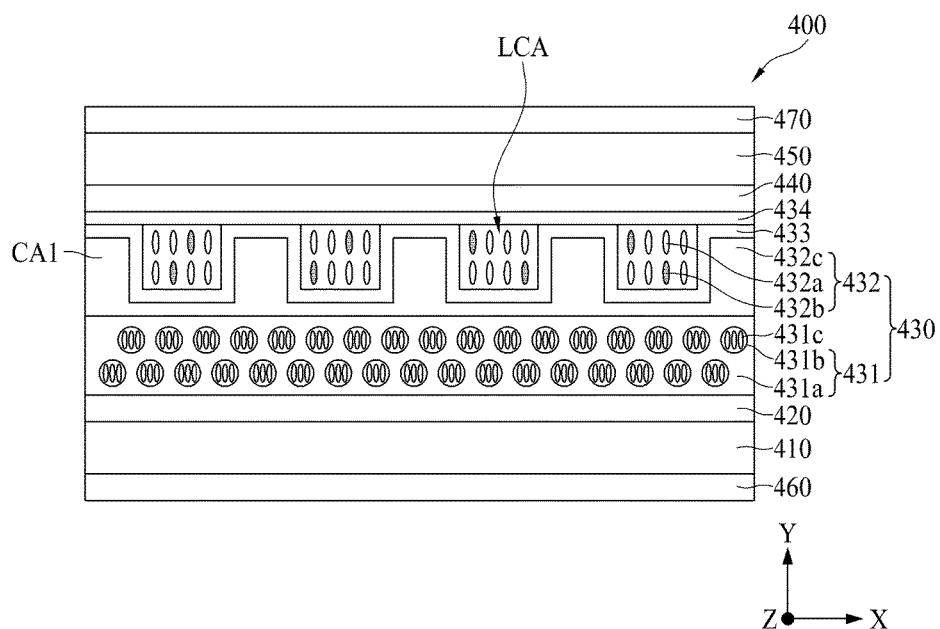
FIGS. 6A to 6D are cross-sectional views illustrating other detailed examples of a light controlling apparatus of FIG. 1.

FIG. 6A is a cross-sectional view illustrating further still another detailed example of a light controlling apparatus of FIG. 1.

As shown in FIG. 6A, a light controlling apparatus 400 according to further still another embodiment of the present invention includes a first substrate 410, a first electrode 420, a plurality of liquid crystal layers 430, a second electrode 440, a second substrate 450, a first refractive index matching layer 460, and a second refractive index matching layer 470.

The first substrate 410, the first electrode 420, the plurality of liquid crystal layers 430, the second electrode 440 and the second substrate 450 of FIG. 6A are substantially the same as the first substrate 110, the first electrode 120, the plurality of liquid crystal layers 130, the second electrode 140, and the second substrate 150, which are described with reference to FIGS. 1 and 2. Therefore, a detailed description of the first substrate 410, the first electrode 420, the plurality of liquid crystal layer 430, the second electrode 440 and the second substrate 450 of FIG. 6A will be omitted.

The first refractive index matching layer 460 may be provided on an opposite surface of one surface of the first substrate 410, on which the first electrode 420 is provided. That is, the first electrode 420 may be provided on one surface of the first substrate 410, and the first refractive index matching layer 460 may be provided on the other surface corresponding to the opposite surface of the one surface of the first substrate 410.

Fresnel reflection may occur due to a difference in a refractive index between the air and the first substrate 410. For example, if there is a difference in a refractive index between the air and the first substrate 410, the light entering the first substrate 410 through the air may be reflected due to the difference in a refractive index between the air and the first substrate 410. Therefore, the first refractive index matching layer 460 may have a refractive index between the air and the first substrate 410 to reduce the difference in a refractive index between the air and the first substrate 410. For example, if the refractive index of the air is 1 and the refractive index of the first substrate 410 is 1.6, the first refractive index matching layer 460 may have a refractive index between 1.1 and 1.5 to reduce the difference in a refractive index between the air and the first substrate 410.

The second refractive index matching layer 470 may be provided on an opposite surface of one surface of the second substrate 450, on which the second electrode 440 is provided. That is, the second electrode 440 may be provided on one surface of the second substrate 450, and the second refractive index matching layer 470 may be provided on the other surface corresponding to the opposite surface of the one surface of the second substrate 450.

Fresnel reflection may occur due to a difference in a refractive index between the air and the second substrate 450. For example, if there is a difference in a refractive index between the air and the second substrate 450, the light entering the second substrate 450 may partially be reflected due to the difference in a refractive index between the air and the second substrate 450 when entering the air. Therefore, the second refractive index matching layer 470 may have a refractive index between the air and the second substrate 450 to reduce the difference in a refractive index between the air and the second substrate 450. For example, if the refractive index of the air is 1 and the refractive index of the second substrate 450 is 1.6, the second refractive index matching layer 470 may have a refractive index between 1.1 and 1.5 to reduce the difference in a refractive index between the air and the second substrate 450.

Each of the first and second refractive index matching layers 460 and 470 may be made of a transparent adhesive film such as an optically clear adhesive (OCA), an organic compound adhesive that enables thermal hardening or UV hardening, etc.

Figure 6B:
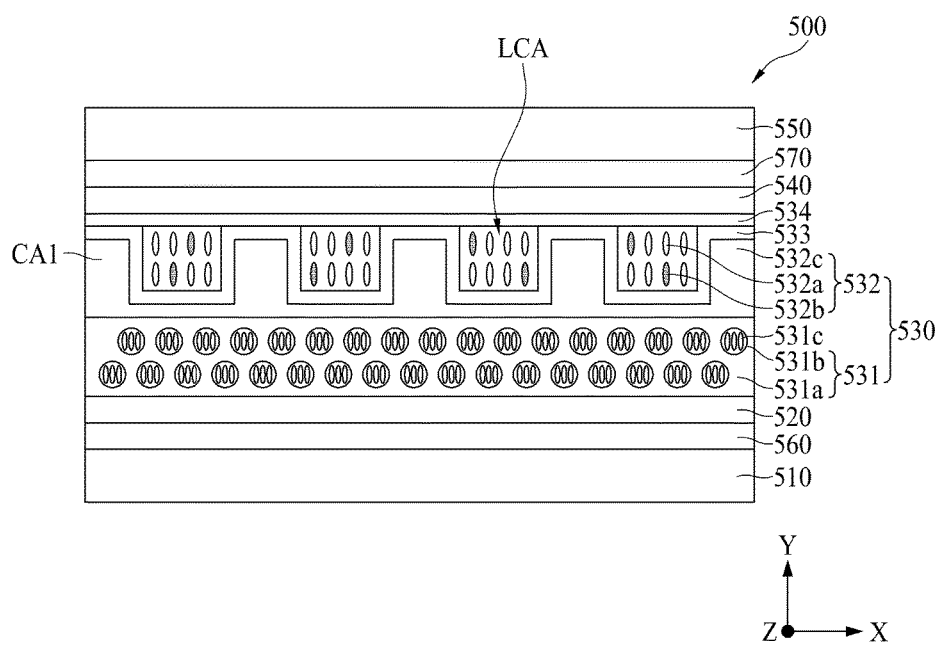

FIG. 6B is a cross-sectional view illustrating further still another detailed example of a light controlling apparatus of FIG. 1.

As shown in FIG. 6B, a light controlling apparatus 500 according to further still another embodiment of the present invention includes a first substrate 510, a first electrode 520, a plurality of liquid crystal layers 530, a second electrode 540, a second substrate 550, a first refractive index matching layer 560, and a second refractive index matching layer 570.

The first substrate 510, the first electrode 520, the plurality of liquid crystal layers 530, the second electrode 540 and the second substrate 550 of FIG. 6B are substantially the same as the first substrate 110, the first electrode 120, the plurality of liquid crystal layers 130, the second electrode 140, and the second substrate 150, which are described with reference to FIGS. 1 and 2. Therefore, a detailed description of the first substrate 510, the first electrode 520, the plurality of liquid crystal layers 530, the second electrode 540 and the second substrate 550 of FIG. 6B will be omitted.

The first refractive index matching layer 560 may be provided between the first substrate 510 and the first electrode 520. Fresnel reflection may occur due to a difference in a refractive index between the first substrate 510 and the first electrode 520. For example, if there is a difference in a refractive index between the first substrate 510 and the first electrode 520, the light that has passed through the first substrate 510 may partially be reflected due to the difference in a refractive index between the first substrate 510 and the first electrode 520 when entering the first electrode 520. Therefore, the first refractive index matching layer 560 may have a refractive index between the first substrate 510 and the first electrode 520 to reduce the difference in a refractive index between the first substrate 510 and the first electrode 520. For example, if the refractive index of the first substrate 510 is 1.6 and the refractive index of the first electrode 520 is 2, the first refractive index matching layer 560 may have a refractive index between 1.7 and 1.9 to reduce the difference in a refractive index between the first substrate 510 and the first electrode 520.

The second refractive index matching layer 570 may be provided between the second substrate 550 and the second electrode 540. Fresnel reflection may occur due to a difference in a refractive index between the second substrate 550 and the second electrode 540. For example, if there is a difference in a refractive index between the second substrate 550 and the second electrode 540, the light that has passed through the second electrode 540 may partially be reflected due to the difference in a refractive index between the second substrate 550 and the second electrode 540 when entering the second substrate 550. Therefore, the second refractive index matching layer 570 may have a refractive index between the second substrate 550 and the second electrode 540 to reduce the difference in a refractive index between the second substrate 550 and the second electrode 540. For example, if the refractive index of the second substrate 550 is 1.6 and the refractive index of the second electrode 540 is 2, the second refractive index matching layer 570 may have a refractive index between 1.7 and 1.9 to reduce the difference in a refractive index between the second substrate 550 and the second electrode 540.

Each of the first and second refractive index matching layers 560 and 570 may be made of a transparent adhesive film such as an optically clear adhesive (OCA), an organic compound adhesive that enables thermal hardening or UV hardening, etc.

Figure 6C:
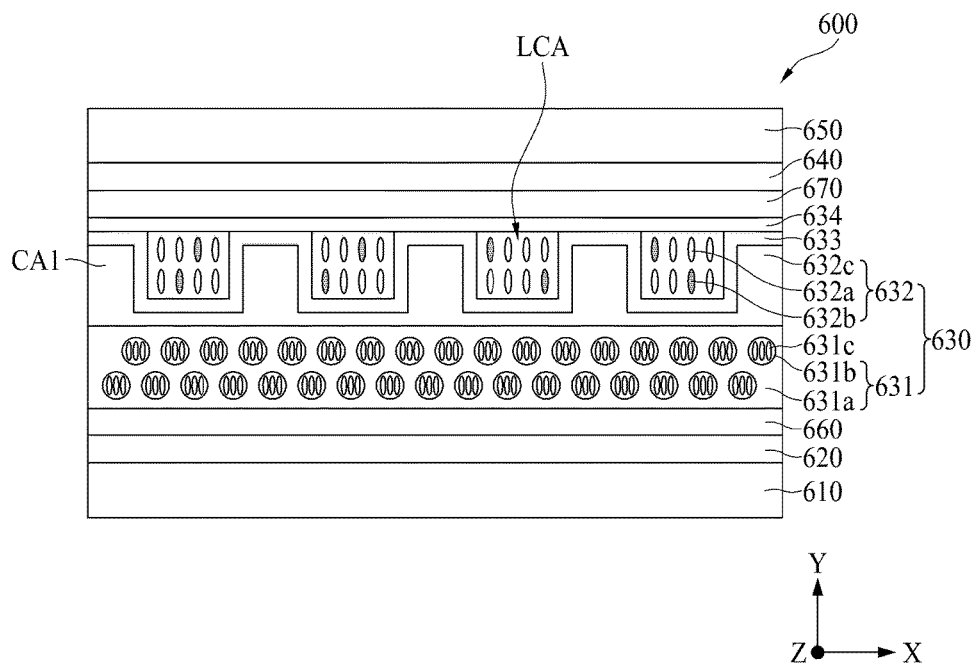

FIG. 6C is a cross-sectional view illustrating further still another detailed example of a light controlling apparatus of FIG. 1.

As shown in FIG. 6C, a light controlling apparatus 600 according to further still another embodiment of the present invention includes a first substrate 610, a first electrode 620, a plurality of liquid crystal layers 630, a second electrode 640, a second substrate 650, a first refractive index matching layer 660, and a second refractive index matching layer 670.

The first substrate 610, the first electrode 620, the plurality of liquid crystal layers 630, the second electrode 640 and the second substrate 650 of FIG. 6C are substantially the same as the first substrate 110, the first electrode 120, the plurality of liquid crystal layers 130, the second electrode 140, and the second substrate 150, which are described with reference to FIGS. 1 and 2. Therefore, a detailed description of the first substrate 610, the first electrode 620, the plurality of liquid crystal layers 630, the second electrode 640 and the second substrate 650 of FIG. 6C will be omitted.

The first refractive index matching layer 660 may be provided between the first electrode 620 and a PDLC layer 631. Fresnel reflection may occur due to a difference in a refractive index between the first electrode 620 and the PDLC layer 631. For example, if there is a difference in a refractive index between the first electrode 620 and the PDLC layer 631, the light that has passed through the first electrode 620 may partially be reflected due to the difference in a refractive index between the first electrode 620 and the PDLC layer 631 when entering the PDLC layer 631. Therefore, the first refractive index matching layer 660 may have a refractive index between the first electrode 620 and the PDLC layer 631 to reduce the difference in a refractive index between the first electrode 620 and the PDLC layer 631. For example, the first electrode 620 may have a refractive index between 1.6 and 1.8, and the PDLC layer 631 may have a refractive index between 1.3 and 1.6. In this case, the first refractive index matching layer 660 may have a refractive index between 1.3 and 1.8 between the first electrode 620 and the PDLC layer 631.

The second refractive index matching layer 670 may be provided between the second electrode 640 and a GHLC layer 632. Fresnel reflection may occur due to a difference in a refractive index between the second electrode 640 and the GHLC layer 632. For example, if there is a difference in a refractive index between the second electrode 640 and the GHLC layer 632, the light that has passed through the second electrode 640 may partially be reflected due to the difference in a refractive index between the second electrode 640 and the GHLC layer 632 when entering the GHLC layer 632. Therefore, the second refractive index matching layer 670 may have a refractive index between the second electrode 640 and the GHLC layer 632 to reduce the difference in a refractive index between the second electrode 640 and the GHLC layer 632. For example, the second electrode 640 may have a refractive index between 1.6 and 1.8, and the GHLC layer 632 may have a refractive index between 1.3 and 1.6. In this case, the second refractive index matching layer 670 may have a refractive index between 1.3 and 1.8 between the second electrode 640 and the GHLC layer 632.

Each of the first and second refractive index matching layers 660 and 670 may be made of a transparent adhesive film such as an optically clear adhesive (OCA), an organic compound adhesive that enables thermal hardening or UV hardening, etc.

Figure 6D:
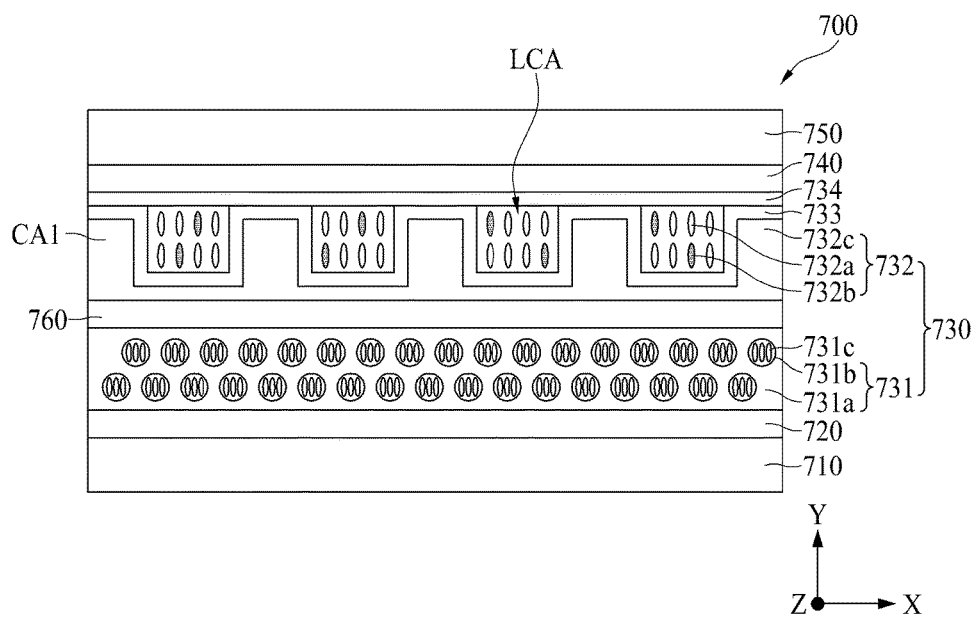

FIG. 6D is a cross-sectional view illustrating further still another detailed example of a light controlling apparatus of FIG. 1.

As shown in FIG. 6D, a light controlling apparatus 700 according to further still another embodiment of the present invention includes a first substrate 710, a first electrode 720, a plurality of liquid crystal layers 730, a second electrode 740, a second substrate 750, and a refractive index matching layer 760.

The first substrate 710, the first electrode 720, the plurality of liquid crystal layers 730, the second electrode 740 and the second substrate 750 of FIG. 6D are substantially the same as the first substrate 110, the first electrode 120, the plurality of liquid crystal layers 130, the second electrode 140, and the second substrate 150, which are described with reference to FIGS. 1 and 2. Therefore, a detailed description of the first substrate 710, the first electrode 720, the plurality of liquid crystal layers 730, the second electrode 740 and the second substrate 750 of FIG. 6D will be omitted.

The refractive index matching layer 760 may be provided between the plurality of liquid crystal layers 730. That is, the refractive index matching layer 760 may be provided between a PDLC layer 731 and a GHLC layer 732. The refractive index matching layer 760 may have a refractive index between the PDLC layer 731 and the GHLC layer 732 to prevent Fresnel reflection from occurring due to a difference in a refractive index between the PDLC layer 731 and the GHLC layer 732.

The refractive index matching layer 760 may be made of a transparent adhesive film such as an optically clear adhesive (OCA), an organic compound adhesive that enables thermal hardening or UV hardening, etc.

As described with reference to FIGS. 6A to 6D, if there is no refractive index matching layer in the light controlling apparatus, for example, Fresnel reflection occurs due to the difference in a refractive index between the first electrode and the PDLC layer and the difference in a refractive index between the second electrode and the GHLC layer when light enters the light controlling apparatus. That is, if the light controlling apparatus is realized in the transparent mode, a considerable amount of light is reflected toward the outside of the PDLC layer due to the difference in a refractive index when the light, which has passed through the first electrode while entering the light controlling apparatus, enters the PDLC layer. Afterwards, when the light, which has passed through the PDLC layer and the GHLC layer, passes through the second electrode again, a considerable amount of light is again reflected toward the inside of the GHLC layer due to the difference in a refractive index between the second electrode and the GHLC layer. Therefore, if the light controlling apparatus is realized in the transparent mode, a considerable amount of light is reflected without passing through the light controlling apparatus, whereby transparency may be deteriorated.

On the other hand, as described with reference to FIGS. 6A to 6D, since the refractive index matching layer is provided in the light controlling apparatus of the present invention, Fresnel reflection little occurs while light is passing through the light controlling apparatus. Therefore, the difference in a refractive index between the first electrode and the PDLC layer and the difference in a refractive index between the second electrode and the GHLC layer are offset by the refractive index matching layer, whereby loss of externally incident light may be avoided, and thus the light may pass through the light controlling apparatus. As a result, more improved transparency may be provided to a user when the light controlling apparatus is realized in the transparent mode.

Also, as already described above, since the refractive index matching layer may be made of a transparent adhesive film such as an optically clear adhesive (OCA), an organic compound adhesive that enables thermal hardening or UV hardening, etc., short that may occur in the light controlling apparatus may be avoided. For example, if a pressure is physically given to the light controlling apparatus, the first electrode and the second electrode are in contact with each other, whereby short may occur in the light controlling apparatus. Also, fine particles may be mixed with the PDLC layer and the GHLC layer during the process of fabricating the light controlling apparatus. The fine particles serve as a conductor that enables electric connection between the first electrode and the second electrode in the PDLC layer and the GHLC layer, whereby short may occur in the light controlling apparatus. However, since the refractive index matching layer of the present invention is made of the aforementioned material, the refractive index matching layer may serve as an insulator. Therefore, the refractive index matching layer may prevent short from occurring in the light controlling apparatus, whereby reliability of the light controlling apparatus may be improved. The light controlling apparatuses 400, 500, 600 and 700 according to the embodiments of the present invention as shown in FIGS. 6A to 6D may be realized in the light shielding mode shielding light and the transparent mode transmitting light by controlling the voltage applied to each of the first and second electrodes. The transparent mode and the light shielding mode of each of the light controlling apparatuses 400, 500, 600 and 700 shown in FIGS. 6A to 6D are substantially the same as those described with reference to FIGS. 3 and 4.

[Method of Fabricating a Light Controlling Apparatus]

A method of fabricating a light controlling apparatus according to the embodiments of the present invention will be described in detail with reference to FIGS. 7, 8A to 8D, 9, 10, 11A to 11C, 12 and 13A and 13B.

FIG. 7 is a flow chart illustrating a method of fabricating a light controlling apparatus according to one embodiment of the present invention. FIGS. 8A to 8D are cross-sectional views illustrating a process of fabricating a light controlling apparatus according to one embodiment of the present invention. Hereinafter, a method of fabricating a light controlling apparatus according to one embodiment of the present invention will be described in detail with reference to FIGS. 7 and 8A to 8D.

Figure 8A:
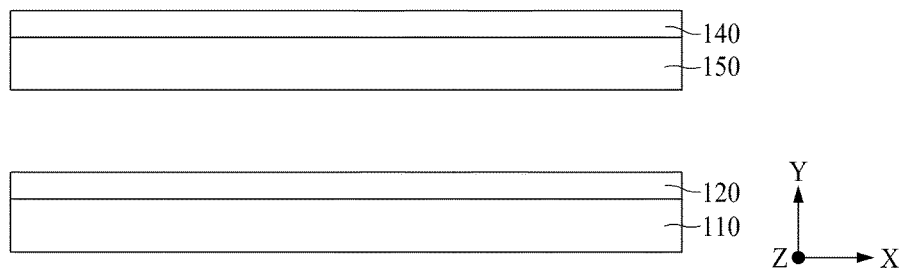
FIGS. 8A to 8D are cross-sectional views illustrating a process of fabricating a light controlling apparatus according to one embodiment of the present invention.

First of all, as shown in FIG. 8A, a first electrode 120 is formed on a first substrate 110, and a second electrode 140 is formed on a second substrate 150. Each of the first substrate 110 and the second substrate 150 may be a glass substrate or a plastic film. Each of the first and second electrodes 120 and 140 may be a transparent electrode (S101 of FIG. 7).

Figure 8B:
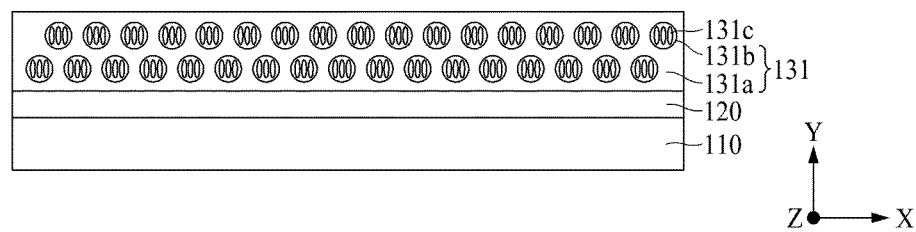

Second, as shown in FIG. 8B, a first liquid crystal material for forming a PDLC layer 131 is coated or formed on the first electrode 120, whereby the PDLC layer 131 is formed.

At this time, the first liquid crystal material is coated or formed on the first electrode 120 and hardened using UV, whereby the PDLC layer 131 may be formed. The first liquid crystal material includes a plurality of monomers, first liquid crystals 131c and a photo-initiator. At this time, a mixture ratio of the plurality of monomers and the first liquid crystals 131c may be in the range of 30 wt %:70 wt % to 50 wt %:50 wt %. If a ratio of the monomers in the first liquid crystal material is 30 wt % or less, a light shielding ratio of the first liquid crystal material is reduced. Also, if the ratio of the plurality of monomers within the first liquid crystal material is 50 wt % or more, a transmittance ratio of the first liquid crystal material is reduced. Therefore, the mixture ratio of the plurality of monomers and the first liquid crystals 131c may be adjusted within the above range by considering the light shielding ratio or the transmittance ratio.

The plurality of monomers have different materials of which surface energies are different from one another, so that the first liquid crystals 131c of the PDLC layer 131 may be arranged in a vertical direction (y-axis direction) when the PDLC layer 131 is formed through UV hardening. Among the plurality of monomers different from one another, the monomer of which surface energy is relative low becomes a polymer 131a during UV hardening and then becomes a surface portion of droplets 131b, whereby surface energy of the droplets 131b is lowered. Therefore, the droplets 131b of which surface energy is lowered allow the first liquid crystals 131c to be arranged in a vertical direction (y-axis direction). A UV wavelength range may be in the range of 10 nm to 400 nm, preferably 320 nm to 380 nm, during UV hardening. A UV irradiation time may be varied depending on the plurality of monomers. For example, the UV irradiation time may be 10 s (10 seconds) to 100 s (100 seconds). In this case, UV intensity may be in the range of 10 mW/cm$^2$ to 50 mW/cm$^2$, preferably in the range of 10 mW/cm$^2$ to 20 mW/cm$^2$.

Alternatively, the droplets 131b having the first liquid crystals 131c in the first liquid crystal material should be included in a solvent so that the first liquid crystals 131c of the PDLC layer 131 may be arranged in a vertical direction (y-axis direction) when the PDLC layer 131 is formed without UV hardening. At this time, the PDLC layer 131 may be formed by coating the first liquid crystal material on the first electrode 120 and drying the first liquid crystal material. When the first liquid crystal material is dried, the solvent is evaporated, and the droplets 131b are modified from a globular shape to an oval shape. Therefore, the first liquid crystals 131c in the droplets 131b of the PDLC layer 131 are arranged in a vertical direction (y-axis direction) (S102 of FIG. 7).

Figure 8C:
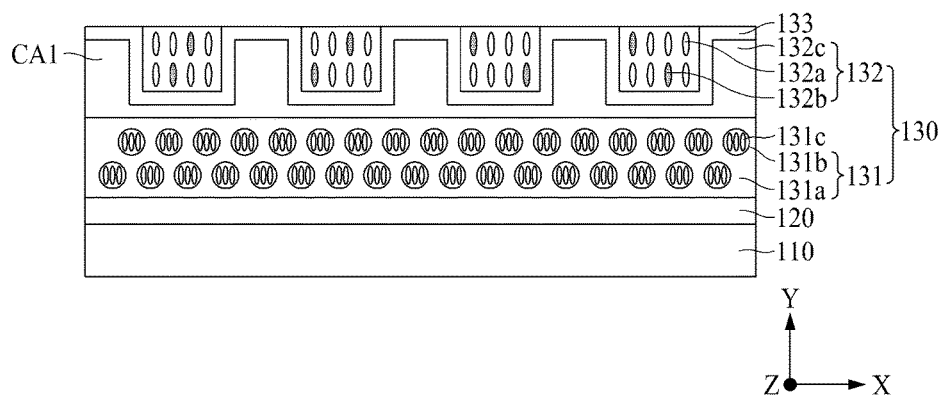

Third, as shown in FIG. 8C, a wall 132c is formed on the PDLC layer 131, a first alignment film 133 is formed on the wall 132c, and a second liquid crystal material is injected into liquid crystal areas LCA between dams CA1 of the wall 132c. The wall 132c may be formed using an imprinting method or a photo lithography method. If the wall 132c is formed in an imprinting type, the wall 132c may be formed in such a manner that a material for forming the wall 132c is coated on the PDLC layer 131 and then pressured by a mold made of silicon, quartz, or polymer material. A pattern of the wall 132c, which is designed with a thickness, height, width, etc. of the dams CA1 of the wall 132c, is formed in the mold. If the wall 132c is formed using a photo lithography method, the wall 132c may be formed in such a manner that a material for forming the wall 132c is coated on the PDLC layer 131 and then exposed using a photo lithography process. The wall 132c may be, but not limited to, any one of a photo resist, a photo-hardening polymer, and polydimethylsiloxane.

The second liquid crystal material may include second liquid crystals 132a and dichroic dyes 132b. In this case, the GHLC layer 132 may be formed by injecting the second liquid crystal material into the liquid crystal areas LCA provided between the dams CA1 of the wall 132c. The dichroic dyes 132b may be included in the second liquid crystal material in the range of 0.5 wt % to 5 wt %. In order to obtain the light shielding ratio by the dichroic dyes 132b in the light shielding mode, the dichroic dyes 132b may be included in the second liquid crystal material in the range of 0.5 wt % or more. Also, since the dichroic dyes 132b partially absorb light even in the transparent mode, the amount of the dichroic dyes 132b should be adjusted so as not to deteriorate the transmittance ratio, thereby obtaining the transmittance ratio in the transparent mode. Therefore, the dichroic dyes 132b may be included in the second liquid crystal material in the range of 5 wt % or less (S103 of FIG. 7).

Figure 8D:
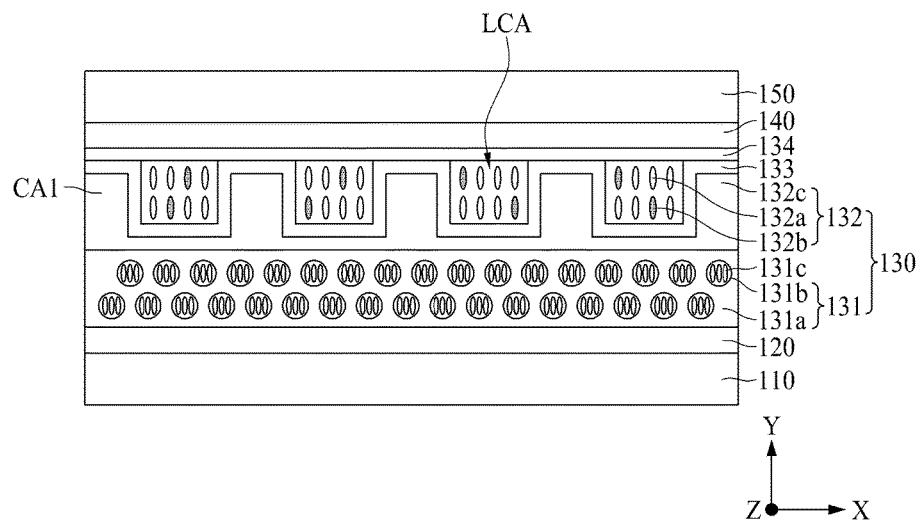

Fourth, as shown in FIG. 8D, a second alignment film 134 is formed on the second electrode 140. At this time, the second alignment film 134 may include an adhesive material to adhere to the first alignment film 133 on the dams CA1 of the wall 132c. Therefore, the first alignment film 133 on the dams CA1 of the wall 132c may adhere to the second alignment film 134. As a result, the first substrate 110 and the second substrate 150 may adhere to each other.

Since the adhesive area between the first alignment film 133 and the second alignment film 134 becomes wider if an area of the dams CA1 of the wall 132c becomes wider, an adhesive force between the first alignment film 133 and the second alignment film 134 may be increased. Therefore, since a problem that the GHLC layer 132 is vulnerable to an external pressure may be solved, the light controlling apparatus having flexibility may be provided. Also, if the first and second substrates 110 and 150 are plastic films, it is difficult to attach the first and second substrates 110 and 150 to each other by using a separate adhesive. Therefore, it is preferable to increase the contact area between the first alignment film 133 and the second alignment film 134 to increase the adhesive force between the first alignment film 133 and the second alignment film 134. However, the area of the liquid crystal areas LCA becomes narrower if the area of the dams CA1 becomes wider. In this case, since the area where the second liquid crystals 132a and the dichroic dyes 132b are provided becomes narrow, a light shielding defect may occur in the light shielding mode. Therefore, the area of the dams CA1 of the wall 132c may be adjusted appropriately considering the light shielding ratio and the adhesive force. For example, the adhesive force between the first alignment film 133 and the second alignment film 134 provided on the dams CA1 of the wall 132c may be in the range of 0.05N/cm$^2$ to 0.3N/cm$^2$. At this time, N/cm$^2$ means a force given to the adhesive area between the first alignment film 133 and the second alignment film 134 when the light controlling apparatus 100 having a width of 1 cm is bent (S104 of FIG. 7).

Alternatively, the first electrode 120 and the PDLC layer 131 may be formed on the first substrate 110, the second electrode 140 may be formed on the second substrate 150, and the wall 132c may be formed on the second electrode 140. And, the first alignment film 133 is formed on the wall 132c, and the second liquid crystal material is injected into the liquid crystal areas LCA provided between the dams CA1 of the wall 132c. Also, the wall 132c is arranged on the PDLC layer 131 and then hardened, whereby the wall 132c may adhere to the PDLC layer 131. In this case, the wall 132c may be cross-linked with the PDLC layer 131 by thermal hardening to support the GHLC layer 132.

Figure 9:
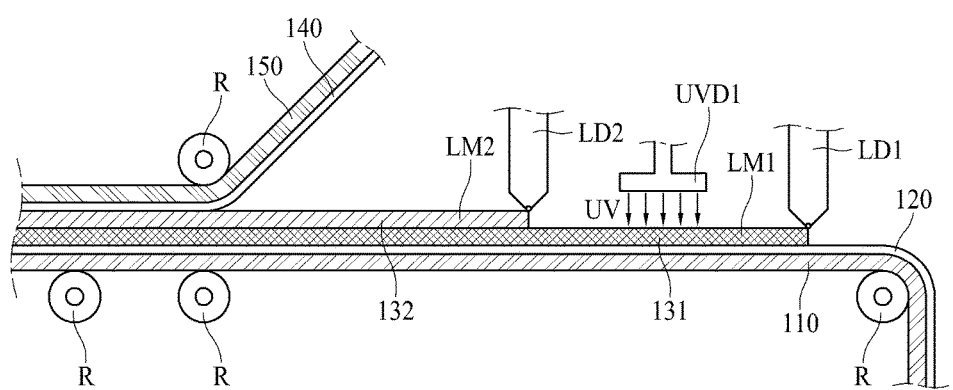
FIG. 9 is another cross-sectional view illustrating a process of fabricating a light controlling apparatus according to one embodiment of the present invention.

Meanwhile, the steps S102 to S104 of FIG. 7 may be performed by a Roll to Roll manner as shown in FIG. 9.

FIG. 9 is a cross-sectional view illustrating another process of fabricating a light controlling apparatus according to one embodiment of the present invention.

As shown in FIG. 9, first of all, the first substrate 110 provided with the first electrode 120 is moved by rollers R, and a first liquid crystal material injecting device LD1 coats a first liquid crystal material LM1 on the first electrode 120. A first UV irradiating device UVD1 irradiates UV to the first liquid crystal material LM1 coated on the first electrode 120, whereby the PDLC layer 131 is formed. The UV energy irradiated to form the PDLC layer 131 is the same as that described with reference to FIG. 8B.

Second, the first substrate 110 provided with the PDLC layer 131 is moved by rollers R, a wall 132c is formed on the PDLC layer 131, a first alignment film 133 is formed on the wall 132c, and a second liquid crystal material injecting device LD2 injects a second liquid crystal material LM2 on the PDLC layer 131 in liquid crystal areas LCA provided between dams CA1 of the wall 132c, whereby a GHLC layer 132 is formed.

Third, the first substrate 110 provided with the PDLC layer 131 and the GHLC layer 132 is moved by rollers R. Therefore, the first substrate 110 may be attached to the second substrate 150 provided with the second alignment film 134 on the second electrode 140 as shown in FIG. 9.

Fourth, the first and second substrates 110 and 150 which are attached to each other may be cut, whereby the light controlling apparatus 100 may be fabricated.

As described above, the light controlling apparatus 100 shown in FIG. 2 may be completed in accordance with the fabricating method according to one embodiment of the present invention, which is shown in FIG. 7, FIGS. 8A to 8D, or FIG. 9. Also, the light controlling apparatuses 400, 500, 600 and 700 according to the other embodiments shown in FIGS. 6A to 6D may be fabricated in accordance with the fabricating method according to one embodiment of the present invention, which is shown in FIG. 7, FIGS. 8A to 8D, or FIG. 9.

Figure 10:
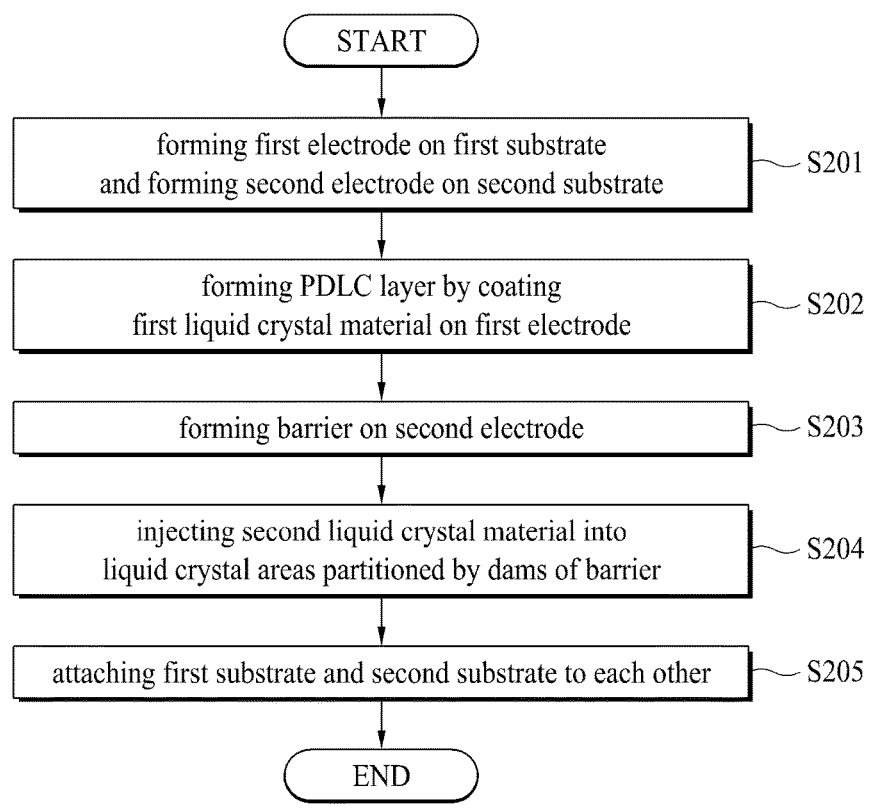
FIG. 10 is a flow chart illustrating a method of fabricating a light controlling apparatus according to another embodiment of the present invention.
Figure 11A:
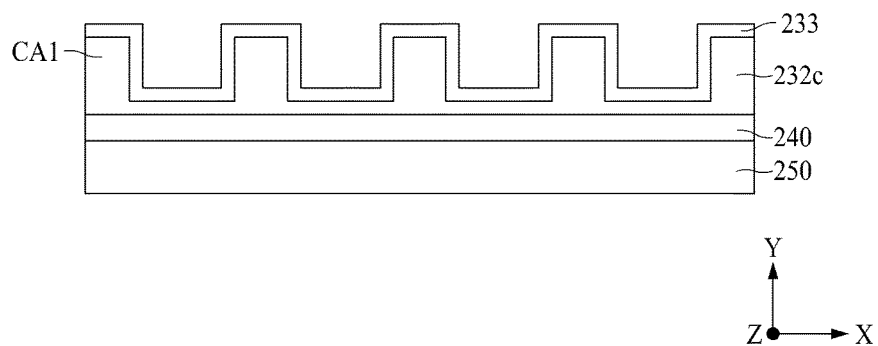
FIGS. 11A to 11C are cross-sectional views illustrating a process of fabricating a light controlling apparatus according to another embodiment of the present invention.
Figure 11B:
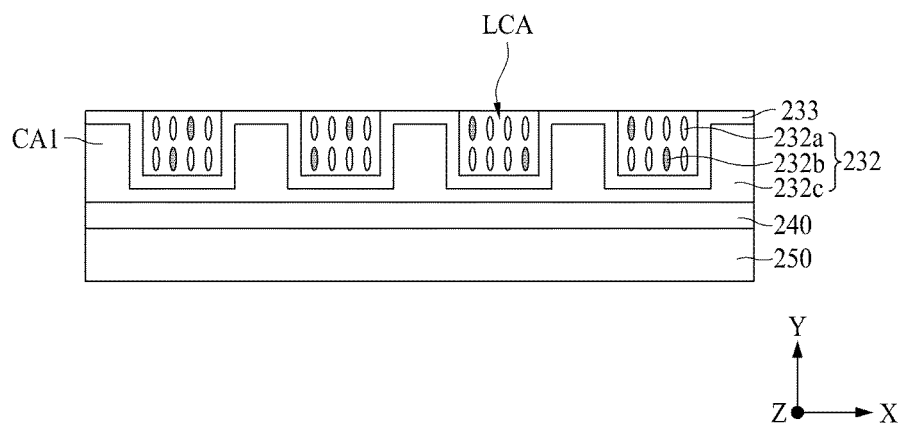
Figure 11C:
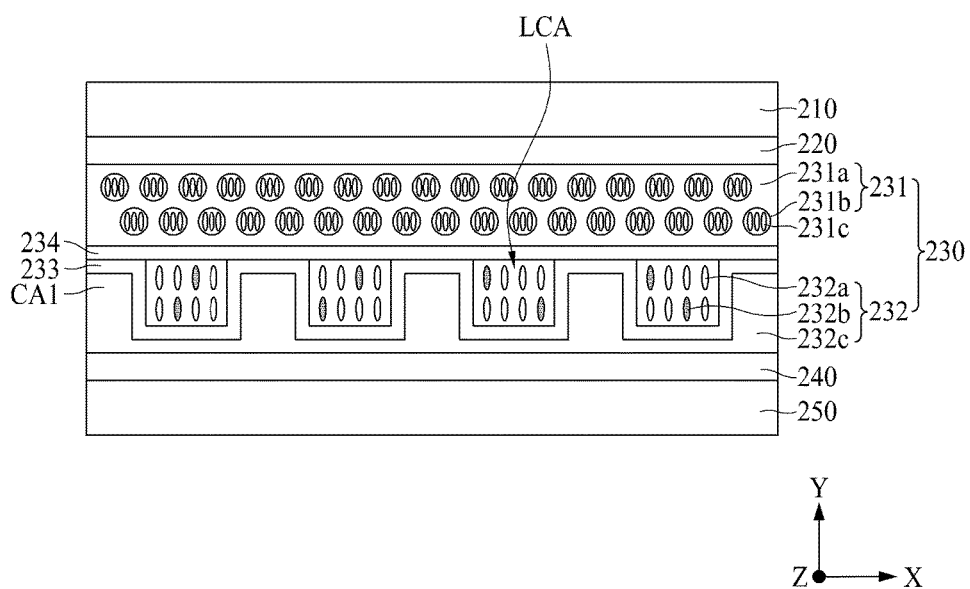

FIG. 10 is a flow chart illustrating a method of fabricating a light controlling apparatus according to another embodiment of the present invention. FIGS. 11A to 11C are cross-sectional views illustrating other process of fabricating a light controlling apparatus according to another embodiment of the present invention. Hereinafter, a method of fabricating a light controlling apparatus according to another embodiment of the present invention will be described with reference to FIGS. 10 and 11A to 11C.

Steps S201 and S202 of the method of fabricating a light controlling apparatus shown in FIG. 10 are substantially the same as the steps S101 and S102 described with reference to FIG. 7 and FIGS. 8A and 8B. Therefore, a detailed description of the steps S201 and S202 of the method of fabricating a light controlling apparatus shown in FIG. 10 will be omitted.

As shown in FIG. 11A, a wall 232c is formed on a second electrode 240, and a first alignment film 233 is formed on the wall 233.

The wall 232c may be formed in an imprinting type or a photo lithography type. If the wall 232c is formed in an imprinting type, the wall 232c may be formed in such a manner that a material for forming the wall 232c is coated on the second electrode 240 and then pressured by a mold made of silicon, quartz, or polymer material. A pattern of the wall 232c, which is designed with a thickness, height, width, etc. of dams CA1 of the wall 232c, is formed in the mold. If the wall 232c is formed in a photo lithography type, the wall 232c may be formed in such a manner that a material for forming the wall 232c is coated on the second electrode 240 and then an area where liquid crystal areas LCA will be provided is partially exposed using a photo process. The wall 232c may be, but not limited to, any one of a photo resist, a photo-hardening polymer, and polydimethylsiloxane (S203 of FIG. 10).

As shown in FIG. 11B, a second liquid crystal material is injected into the liquid crystal areas LCA provided between the dams CA1 of the wall 232c. The second liquid crystal material may include second liquid crystals 232a and dichroic dyes 232b. In this case, a GHLC layer 232 may be formed by injection of the second liquid crystal material into the liquid crystal areas LCA provided between the dams CA1 of the wall 232c. The dichroic dyes 232b may be included in the second liquid crystal material in the range of 0.5 wt % to 5 wt %. In order to obtain the light shielding ratio by the dichroic dyes 232b in the light shielding mode, the dichroic dyes 232b may be included in the second liquid crystal material in the range of 0.5 wt % or more. Also, since the dichroic dyes 232b may partially absorb light even in the transparent mode, the amount of the dichroic dyes 232b should be adjusted so as not to deteriorate the transmittance ratio of the light. Therefore, the dichroic dyes 232b may be included in the second liquid crystal material in the range of 5 wt % or less (S204 of FIG. 10).

As shown in FIG. 11C, a second alignment film 234 adheres to the first alignment film 233 provided on the dams CA1 of the wall 232c through a lamination process. The second alignment film 234 may include an adhesive material. Meanwhile, since the adhesive area between the first alignment film 233 and the second alignment film 234 becomes wider if an area of the dams CA1 of the wall 232c becomes wider, an adhesive force between the first alignment film 233 and the second alignment film 234 may be increased. Therefore, since a problem that the GHLC layer 232 is vulnerable to an external pressure may be solved, the light controlling apparatus having flexibility may be provided. Also, if the first and second substrates 210 and 250 are plastic films, it is difficult to attach the first and second substrates 210 and 250 to each other by using a separate adhesive. Therefore, it is preferable to increase the contact area between the first alignment film 233 and the second alignment film 234 to increase the adhesive force between the first alignment film 233 and the second alignment film 234. However, the area of the liquid crystal areas LCA becomes narrower if the area of the dams CA1 becomes wider. In this case, since the area where the second liquid crystals 232a and the dichroic dyes 232b are provided becomes narrow, a light shielding defect may occur in the light shielding mode. Therefore, the area of the dams CA1 of the wall 232c may be adjusted preferably considering the light shielding ratio and the adhesive force. For example, the adhesive force between the first alignment film 233 and the second alignment film 234 provided on the dams CA1 of the wall 232c may be in the range of $0.05N/cm^2$ to $0.3N/cm^2$. At this time, $N/cm^2$ means a force given to the adhesive area between the first alignment film 233 and the second alignment film 234 when the light controlling apparatus 200 having a width of 1 cm is bent (S205 of FIG. 10).

Alternatively, the first electrode 220 and the PDLC layer 231 may be formed on the first substrate 210, the second electrode 240 may be formed on the second substrate 250, and the wall 232c may be formed on the second electrode 240. And, the first alignment film 233 is formed on the wall 232c, and the second liquid crystal material is injected into the liquid crystal areas LCA provided between the dams CA1 of the wall 232c. Also, the wall 232c is arranged on the PDLC layer 231 and then hardened, whereby the wall 232c may adhere to the PDLC layer 231. In this case, the wall 232c may be cross-linked with the PDLC layer 231 by thermal hardening to support the GHLC layer 232.

Also, the steps S202 to S205 shown in FIGS. 10 and 11A to 11C may be performed by a Roll to Roll manner described with reference to FIGS. 8A to 8D and 10.

As described above, the light controlling apparatus 200 shown in FIG. 5A may be completed in accordance with the fabricating method according to another embodiment of the present invention, which is shown in FIG. 10 and FIGS. 11A to 11C.

Figure 12:
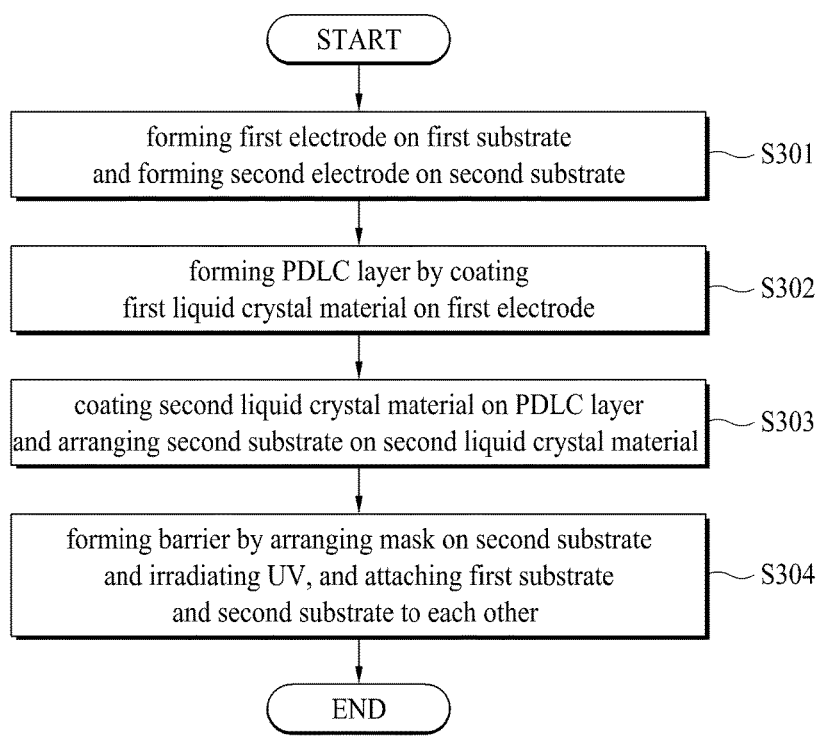
FIG. 12 is a flow chart illustrating a method of fabricating a light controlling apparatus according to another embodiment of the present invention.
Figure 13A:
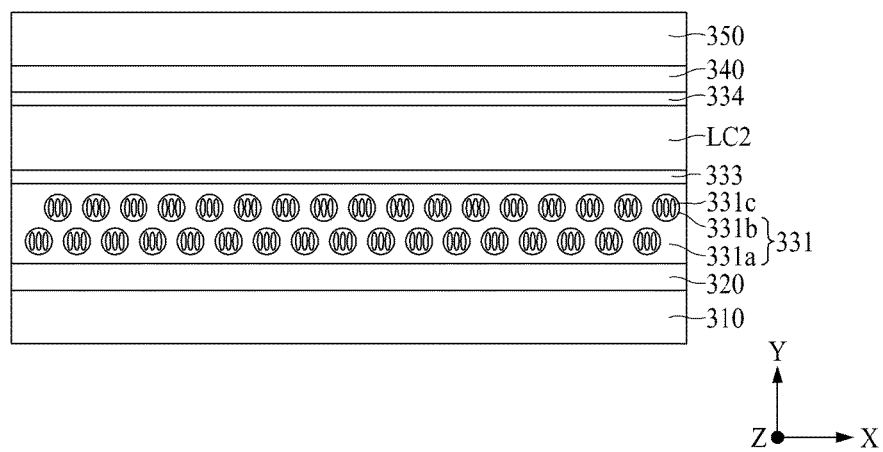
FIGS. 13A to 13B are cross-sectional views illustrating a process of fabricating a light controlling apparatus according to another embodiment of the present invention.
Figure 13B:
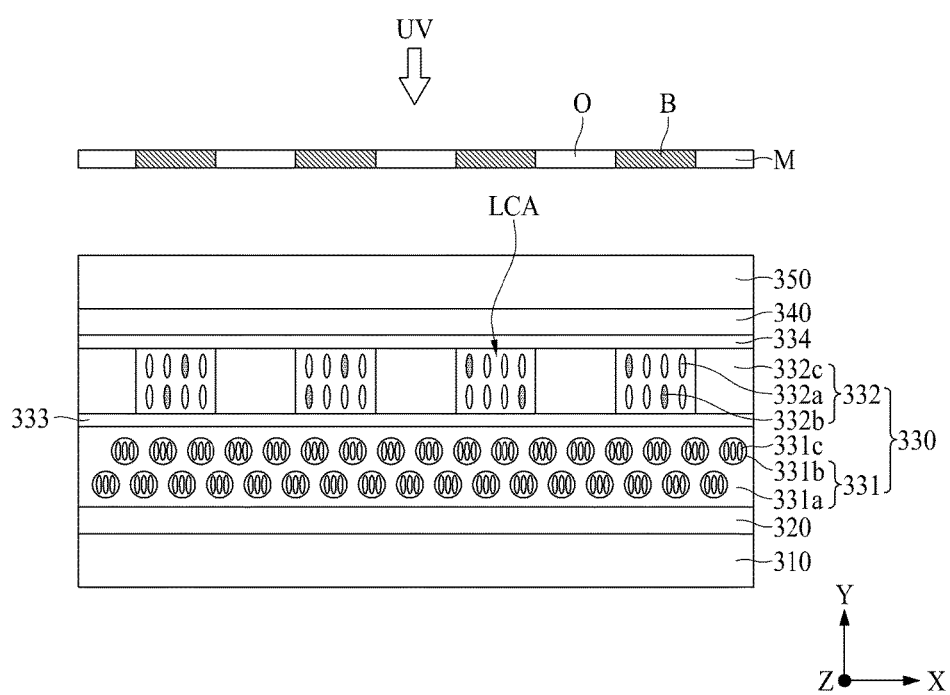

FIG. 12 is a flow chart illustrating a method of fabricating a light controlling apparatus according to other embodiment of the present invention. FIGS. 13A and 13B are cross-sectional views illustrating other process of fabricating a light controlling apparatus according to other embodiment of the present invention. Hereinafter, a method of fabricating a light controlling apparatus according to other embodiment of the present invention will be described with reference to FIG. 12 and FIGS. 13A and 13B.

Steps S301 and S302 of the method of fabricating a light controlling apparatus shown in FIG. 12 are substantially the same as the steps S101 and S102 described with reference to FIGS. 8A to 8D and FIG. 9. Therefore, a detailed description of the steps S301 and S302 of the method of fabricating a light controlling apparatus shown in FIG. 12 will be omitted.

As shown in FIG. 13A, a first alignment film 333 is formed on a PDLC layer 331, a second liquid crystal material LC2 is coated on the first alignment film 333, and a second substrate 340 is arranged on the second liquid crystal material LC2.

The second liquid crystal material LC2 may include second liquid crystals 332a, dichroic dyes 332b, and photo-hardening polymers. The dichroic dyes 332b may be included in the second liquid crystal material in the range of 0.5 wt to 5 wt %. In order to obtain the light shielding ratio by the dichroic dyes 332b in the light shielding mode, the dichroic dyes 332b may be included in the second liquid crystal material in the range of 0.5 wt % or more. Meanwhile, if UV is irradiated to the dichroic dyes 332b, the dichroic dyes 332b absorb UV, whereby monomers may not be partially hardened to polymers. If the amount of the dichroic dyes 332b is increased, the amount of the monomers remaining in the GHLC layer 332 is increased by UV absorption of the dichroic dyes 332b. For this reason, a problem may occur in that a transmittance ratio of the GHLC layer 332 is reduced in the transparent mode. Therefore, the dichroic dyes 332b may be included in the second liquid crystal material in the range of 5 wt % or less (S303 of FIG. 12).

As shown in FIG. 13B, a mask M, which includes opening areas O and blocked areas B, is arranged on the second substrate 350, photo-hardening polymers of the second liquid crystal material LC2 are hardened by UV irradiation to form walls 332c. In more detail, the photo-hardening polymers on an area where UV is irradiated through the opening areas O of the mask M are hardened, while the photo-hardening polymers on an area where UV is not irradiated are moved to a place where a concentration of the polymer is high. Therefore, the photo-hardening polymers of the second liquid crystal material are concentrated on an area opposite to the opening area O of the mask M, into which UV is irradiated. For this reason, the wall 332c is formed. Particularly, the wall 332c is stuck to the first and second alignment films 333 and 334, whereby first and second substrates 310 and 350 are attached to each other (S304 of FIG. 12).

As described above, the fabricating method according to another embodiment of the present invention, which is shown in FIG. 12 and FIGS. 13A and 13B, the liquid crystal material is not injected between the first substrate and the second substrate but coated on the substrate and hardened using UV. Therefore, the fabricating process may be simplified, whereby the light controlling apparatus 300 may be completed at a low cost.

[Transparent Display Device]

A transparent display device according to the embodiments of the present invention will be described in detail with reference to FIGS. 14 to 18.

Figure 14:
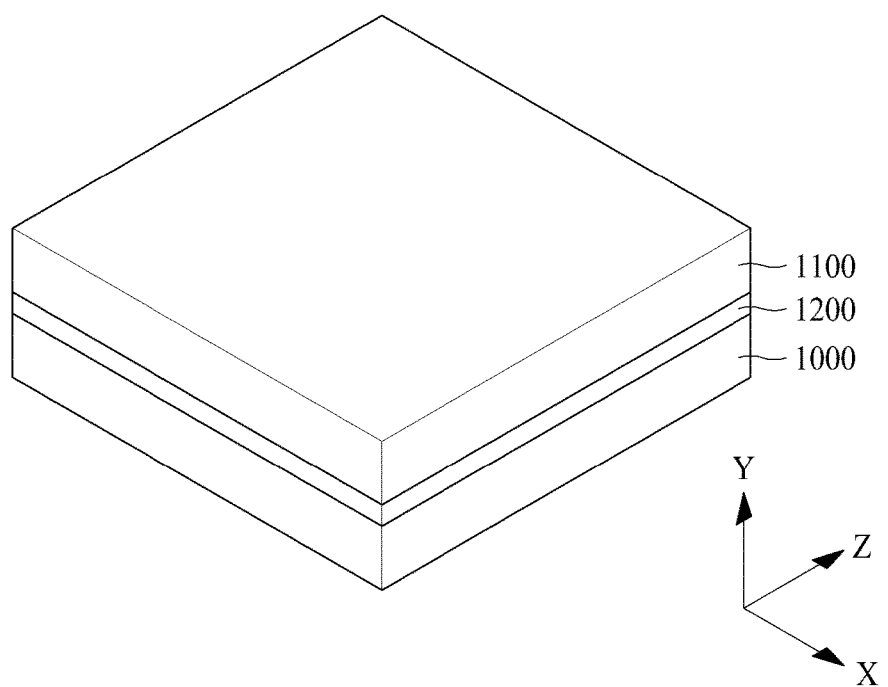
FIG. 14 is a perspective view illustrating a transparent display device according to one embodiment of the present invention.

FIG. 14 is a perspective view illustrating a transparent display device according to the embodiment of the present invention. With reference to FIG. 14, the transparent display device includes a light controlling apparatus 1000, a transparent display panel 1100, and an adhesive layer 1200.

The light controlling apparatus 1000 may be realized as any one of the light controlling apparatuses 100, 200, 300, 400, 500, 600 and 700 according to the embodiments of the present invention described with reference to FIGS. 2, 5A, 5B and 6A to 6D. Therefore, the light controlling apparatus 1000 may shield incident light in a light shielding mode and transmit incident light in a transparent mode. Also, the light controlling apparatus 1000 may allow its rear background not to be displayed by displaying a specific color in accordance with dichroic dyes, whereby the light controlling apparatus 1000 may provide a user with esthetic effect in addition to a light shielding function.

Figure 15A:
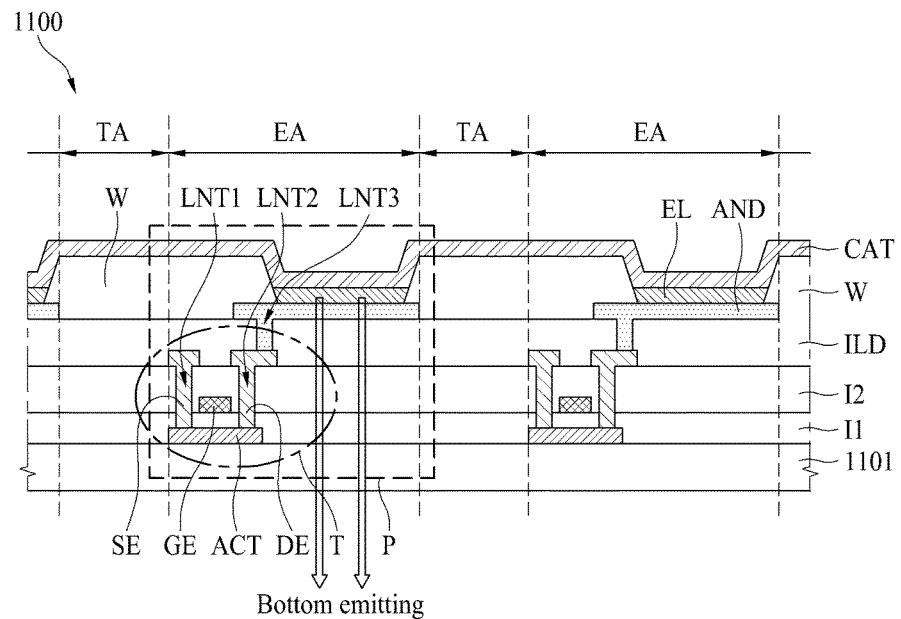
FIG. 15A is a cross-sectional view illustrating an example of a lower substrate of a transparent display panel of FIG. 14.
Figure 15B:
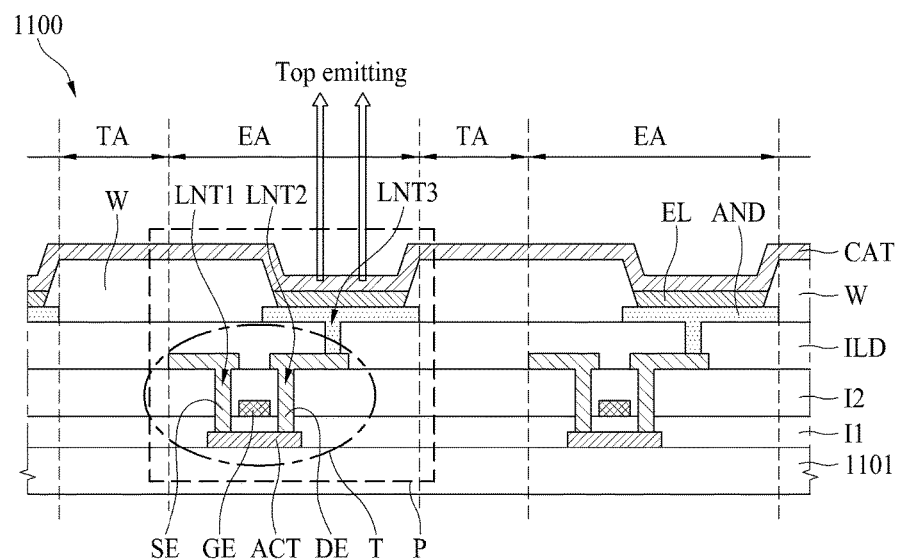
FIG. 15B is another cross-sectional view illustrating another example of a lower substrate of a transparent display panel of FIG. 14.

FIG. 15A is a cross-sectional view illustrating a detailed example of a lower substrate of a transparent display panel of FIG. 14. FIG. 15B is a cross-sectional view illustrating another detailed example of a lower substrate of a transparent display panel of FIG. 14.

As shown in FIGS. 15A and 15B, the transparent display panel 1100 includes a transmissive area TA and an emissive area EA in one sub pixel area. The emissive area EA indicates an area where an actual image is displayed, and the transmissive area TA indicates an area where external light is transmitted to the transparent display panel. Therefore, if the transparent display panel is not driven, the user may watch a background of the transparent display panel, that is, an object of a rear side or rear background of the transparent display panel through the transmissive area TA. Alternatively, if the transparent display panel is driven, the user may simultaneously watch the actual image of the emissive area EA and the background through the transmissive area TA. An area ratio of the emissive area EA and the transmissive area TA in the sub pixel area may be adjusted variously in view of visibility and a transmittance ratio.

Pixels P displaying an image are provided in the emissive area EA. Each of the pixels P may be provided with a transistor device T, an anode electrode AND, an organic layer EL, and a cathode electrode CAT as shown in FIGS. 15A and 15B.

The transistor device T includes an active layer ACT provided on a lower substrate 1101, a first insulating film I1 provided on the active layer ACT, a gate electrode GE provided on the first insulating film I1, a second insulating film I2 provided on the gate electrode GE, and source and drain electrodes SE and DE provided on the second insulating film I2 and connected to the active layer ACT through first and second contact holes CNT1 and CNT2. Although the transistor device T is formed in a top gate type in FIGS. 15A and 15B, the transistor device T may be formed in a bottom gate type without limitation to the top gate type.

The anode electrode AND is connected to the drain electrode DE of the transistor device T through a third contact hole CNT3 that passes through an inter layer dielectric ILD provided on the source and drain electrodes SE and DE. A wall is provided between the anode electrodes AND adjacent to each other, whereby the anode electrodes AND adjacent to each other may be insulated electrically.

The organic layer EL is provided on the anode electrode AND. The organic layer El may include a hole transporting layer, an organic light emitting layer, and an electrode transporting layer.

The cathode electrode CAT is provided on the organic layer EL and the wall W. If a voltage is applied to the anode electrode AND and the cathode electrode CAT, holes and electrons are moved to an organic light emitting layer through the hole transporting layer and the electron transporting layer and combined with each other in the organic light emitting layer to emit light.

The transparent display panel 1100 is formed in a bottom emission type in FIG. 15a. If the transparent display panel 1100 is formed in a bottom emission type, light is emitted toward the lower substrate 1101. Therefore, the light controlling apparatus 1000 may be arranged on an upper substrate.

In the bottom emission type, since light of the organic layer EL is emitted toward the lower substrate 1101, the transistor T may be provided below the wall W to reduce luminance reduction caused by the transistor T. Also, in the bottom emission type, the anode electrode AND may be formed of a transparent metal material such as ITO and IZO, and the cathode electrode CAT may be formed of a metal material having high reflectivity such as aluminum or a structure having aluminum and ITO. And, to improve the transmittance ratio, the cathode electrode CAT may be formed by patterning in the emissive area EA only.

The transparent display panel 1100 is formed in a top emission type in FIG. 15B. If the transparent display panel 1100 is formed in a top emission type, light is emitted toward the upper substrate. Therefore, the light controlling apparatus 1000 may be arranged below the lower substrate 1101.

In the top emission type, since light of the organic layer EL is emitted toward the upper substrate, the transistor T may be provided in a wide range below the wall W and the anode electrode AND. Therefore, the top emission type has an advantage in that a design area of the transistor T is wider than that of the bottom emission type. Also, in the top emission type, the anode electrode AND may be formed of a metal material having high reflectivity such as aluminum or a structure having aluminum and ITO, and the cathode electrode CAT may be formed of a transparent metal material such as ITO and IZO.

The transparent display panel according to the embodiment of the present invention may be realized in a dual emission type. In the dual emission type, light is emitted toward both the upper substrate and the lower substrate.

The adhesive layer 1200 bonds the light controlling apparatus 1000 and the transparent display panel 1100 to each other. The adhesive layer 1200 may be a transparent adhesive film such as an optically clear adhesive (OCA) or a transparent adhesive such as an optically clear resin (OCR).

If the light controlling apparatus 1000 is attached to a light emission direction of the transparent display panel 1100, the emissive area EA of the transparent display panel 1100 should not be shielded, whereas the transmissive area TA of the transparent display panel 1100 should be shielded. Therefore, the light controlling apparatus 1000 may form a light shielding area by patterning to shield the transmissive area TA only of the transparent display panel 1100. In this case, the light shielding area should be aligned in the transmissive area TA of the transparent display panel 1100.

As described above, if the light controlling apparatus 1000 is attached to the light emission direction of the transparent display panel 1100, the light shielding area of the light controlling apparatus 1000 should be patterned and should be aligned in the transmissive area TA of the transparent display panel 1100, whereby the light controlling apparatus 1000 will preferably be attached to an opposite direction of the light emission direction of the transparent display panel 1100. For example, in case of the top emission type as shown in FIG. 15b, one surface of the adhesive layer 1200 may be bonded to a surface below the lower substrate 1101 of the transparent display panel 1100, and the other surface of the adhesive layer 1200 may be bonded to the light controlling apparatus 1000. In case of the bottom emission type as shown in FIG. 15A, one surface of the adhesive layer 1200 may be bonded to a surface above the upper substrate of the transparent display panel 1100, and the other surface of the adhesive layer 1200 may be bonded to the light controlling apparatus 1000. If the adhesive layer 1200 is comprised of a transparent adhesive film such as OCA or a transparent adhesive such as OCR, the adhesive layer 1200 may have a refractive index between 1.4 and 1.9.

Also, the transparent display device may use dichroic dyes having an excellent dichroic ratio (DR) to realize a true black. The DR represents a long axial light absorption ratio of the dichroic dyes to a short axial light absorption. Since the dichroic dyes are arranged in a vertical direction (y-axis direction) in the transparent mode and arranged in a horizontal direction in the light shielding mode, the short axial light absorption ratio of the dichroic dyes may be a light absorption ratio of the dichroic dyes in the transparent mode, and the long axial light absorption ratio of the dichroic dyes may be a light absorption ratio of the dichroic dyes in the light shielding mode. To realize the transparent display device of a true black, it may be efficient that the dichroic dyes of which DR is more than 7 are used.

Also, the lower substrate 1101 or the upper substrate of the transparent display panel 1100 may be a second substrate of the light controlling apparatus 1000. In this case, the second electrode 140 of the light controlling apparatus 1000 may be provided on the lower substrate 1101 or the upper substrate of the transparent display panel 1100.

The transparent display panel 1100 may be realized in a display mode in which pixels P display an image and a non-display mode in which pixels do not display an image. If the transparent display panel 1100 is realized in a display mode in which pixels display an image, the light controlling apparatus 1000 may be realized in a light shielding mode for shielding light incident through a rear surface of the transparent display panel 1100 to increase quality of the image.

In the non-display mode in which pixels P do not display an image, the light controlling apparatus 1000 may be realized in a light shielding mode or a transparent mode. In the non-display mode in which pixels P do not display an image, if the light controlling apparatus 1000 is realized in a light shielding mode, the transparent display device is seen to a user as a black color. In the non-display mode in which pixels P do not display an image, if the light controlling apparatus 1000 is realized in a transparent mode, the transparent display device is realized transparently, whereby the user may see a rear background of the transparent display device through the transparent display device.

Also, since the emissive area EA of the transparent display panel 1100 shields light regardless of the light shielding mode or the transparent mode of the light controlling apparatus 1000, it is preferable that the dams CA1 of the wall 132c of the GHLC layer 132 are provided in the emissive area EA. Since the contact area between the first alignment film 233 and the second alignment film 234 becomes wider if the area of the dams CA1 of the wall 232c becomes wider, in the embodiment of the present invention, the dams CA1 of the wall 132c of the GHLC layer 132 are formed to have a wider area in the emissive area EA if possible, whereby the adhesive force between the first alignment film 233 and the second alignment film 234 may be increased.

Figure 16:
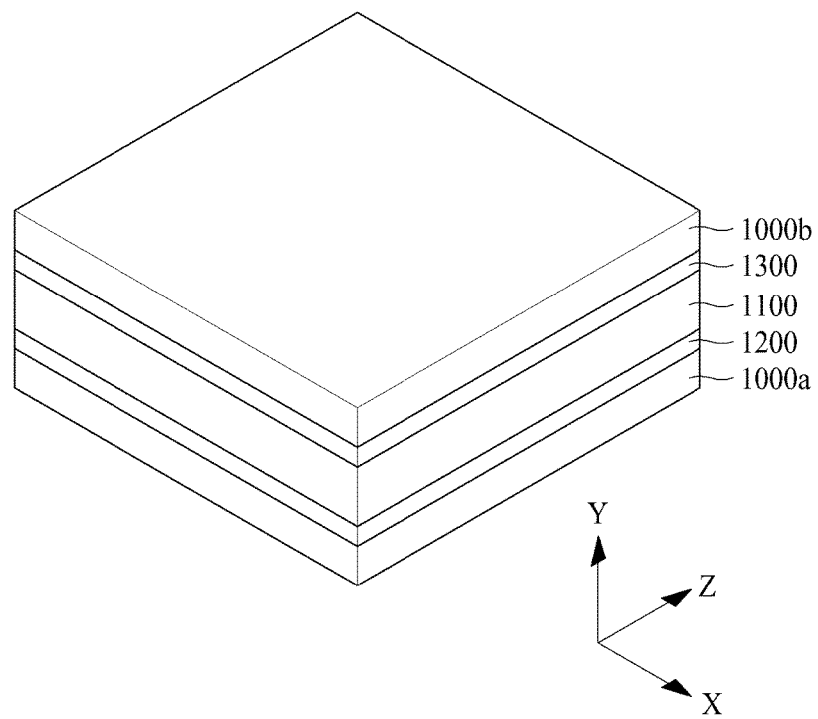
FIG. 16 is a perspective view illustrating a transparent display device according to another embodiment of the present invention.

FIG. 16 is a perspective view illustrating a transparent display device according to another embodiment of the present invention. With reference to FIG. 16, the transparent display device includes a light controlling apparatus 1000a, a second light controlling apparatus 1000b, a transparent display panel 1100, a first adhesive layer 1200, and a second adhesive layer 1300.

Each of the first and second light controlling apparatuses 1000a and 1000b may be realized as any one of the light controlling apparatuses 100, 200, 300, 400, 500, 600 and 700 according to the embodiments of the present invention described with reference to FIGS. 1, 2, 5A, 5B and 6A to 6D. Therefore, the first and second light controlling apparatuses 1000a and 1000b may shield incident light in a light shielding mode and transmit incident light in a transparent mode. Each of the first and second light controlling apparatuses 1000a and 1000b may provide a user with esthetic effect in addition to a light shielding function in accordance with dichroic dyes.

The transparent display panel 1100 is substantially the same as that described with reference to FIG. 14 and FIGS. 15A and 15B. Therefore, a detailed description of the transparent display panel 1100 of FIG. 16 will be omitted.

The first adhesive layer 1200 bonds the first light controlling apparatus 1000a and the transparent display panel 1100 to each other. The first adhesive layer 1200 may be a transparent adhesive film such as an optically clear adhesive (OCA). One surface of the first adhesive layer 1200 may be bonded to a surface below a lower substrate 1101 of the transparent display panel 1100 or bonded onto an upper substrate, and the other surface of the first adhesive layer 1200 may be bonded to the first light controlling apparatus 1000a. If the first adhesive layer 1200 is comprised of a transparent adhesive film such as OCA, the first adhesive layer 1200 may have a refractive index between 1.4 and 1.9.

The second adhesive layer 1300 bonds the second light controlling apparatus 1000b and the transparent display panel 1100 to each other. The second adhesive layer 1300 may be a transparent adhesive film such as an optically clear adhesive (OCA). One surface of the second adhesive layer 1300 may be bonded to a surface below the lower substrate 1101 of the transparent display panel 1100 or bonded onto the upper substrate, and the other surface of the second adhesive layer 1300 may be bonded to the second light controlling apparatus 1000b. If the second adhesive layer 1300 is comprised of a transparent adhesive film such as OCA, the second adhesive layer 1300 may have a refractive index between 1.4 and 1.9.

The transparent display panel 1100 may be realized in a display mode in which pixels P display an image and a non-display mode in which pixels P do not display an image. It is assumed that a user watches an image through the second light controlling apparatus 1000b. In this case, if the transparent display panel 1100 is realized in a display mode in which pixels P display an image, the first light controlling apparatus 1000a may be realized in a light shielding mode for shielding the light incident through a rear surface of the transparent display panel 1100 to increase quality of the image, and the second light controlling apparatus 1000b is preferably realized in a transparent mode.

In the non-display mode in which pixels P do not display an image, the first and second light controlling apparatuses 1000a and 1000b may be realized in a light shielding mode or a transparent mode. In the non-display mode in which pixels P do not display an image, if the first and second light controlling apparatuses 1000a and 1000b are realized in a light shielding mode, the transparent display device is seen to a user as a black color. In the non-display mode in which pixels P do not display an image, if the first and second light controlling apparatuses 1000a and 1000b are realized in a transparent mode, the transparent display device is realized transparently, whereby the user may see a rear background of the transparent display device through the transparent display device.

Meanwhile, the transparent display panel 1100 may be provided as a dual transparent display panel that may display an image in dual directions. In a display mode in which the dual transparent display panel displays an image in dual directions, if the first and second light controlling apparatuses 1000a and 1000b are realized in a transparent mode, users may view an image in dual directions. Also, in a display mode in which the dual transparent display panel displays an image in dual directions, if any one of the first and second light controlling apparatuses 1000a and 1000b is realized in a light shielding mode, the corresponding light controlling apparatus may prevent the user from watching an image in any one direction of the dual directions.

Figure 17:
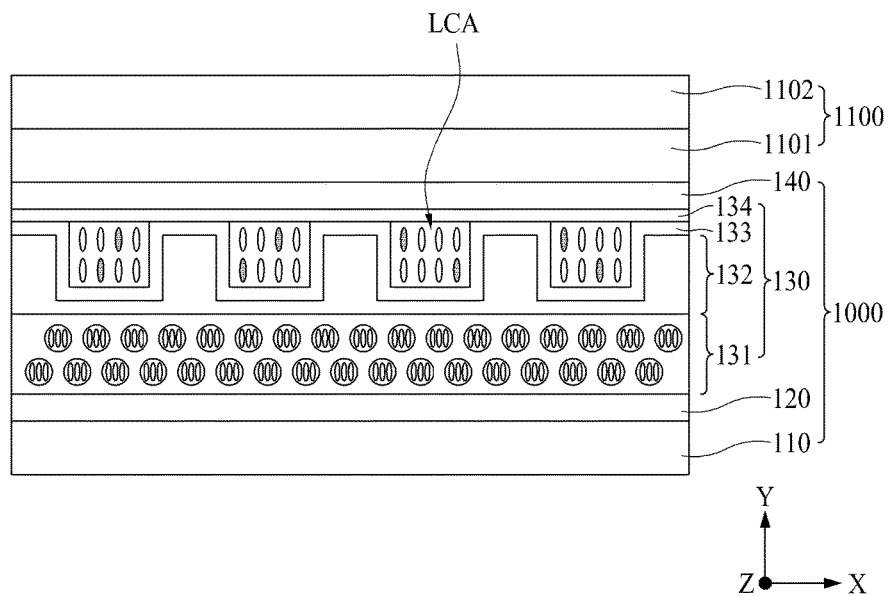
FIG. 17 is a cross-sectional view illustrating a transparent display device according to another embodiment of the present invention.

FIG. 17 is a cross-sectional view illustrating a transparent display device according to another embodiment of the present invention. With reference to FIG. 17, the transparent display device includes a light controlling apparatus 1000 and a transparent display panel 1100.

Although the section of the transparent display panel 1100 may be substantially the same as that of the bottom emission type shown in FIG. 15A or that of the top emission type shown in FIG. 15B, the lower substrate 1101 and the upper substrate 1102 are shown in FIG. 17 for convenience of description. If the transparent display panel 1100 is formed in a top emission type as shown in FIG. 15B, light of the transparent display panel 1100 is emitted toward the upper substrate 1102, whereby the light controlling apparatus 1000 may be arranged below the lower substrate 1101 as shown in FIG. 17. Also, if the transparent display panel 1100 is formed in a bottom emission type as shown in FIG. 15A, light of the transparent display panel 1100 is emitted toward the lower substrate 1101, whereby the light controlling apparatus 1000 may be arranged on the upper substrate 1102.

If the transparent display panel 1100 is formed in a top emission type as shown in FIG. 15b, the light controlling apparatus 1000 of FIG. 17 may be realized to be substantially the same as the light controlling apparatus shown in FIG. 2 except that the second electrode 140 is formed on the lower substrate 1101 of the transparent display panel 1100 not the second substrate. Also, if the transparent display panel 1100 is formed in a bottom emission type as shown in FIG. 15a, the light controlling apparatus 1000 of FIG. 17 may be realized to be substantially the same as the light controlling apparatus shown in FIG. 2 except that the second electrode 140 is formed on the upper substrate 1102 of the transparent display panel 1100 not the second substrate.

Also, a refractive index matching layer may be provided between the second electrode 140 and the lower substrate 1101 to reduce a difference in a refractive index between the second electrode 140 and the lower substrate 1101. Moreover, a passivation film for surrounding a side of the PDLC layer 131 or a side and a lower surface of the PDLC layer 131 may be provided. The lower surface of the PDLC layer 131 represents one surface of the PDLC layer 131, which is in contact with the first electrode 120. Also, the passivation film may serve to passivate the first electrode 120 as well as the PDLC layer 131. The passivation film may be made of a transparent inorganic material that has certain strength and at the same may transmit external light. The passivation film may be made of, but not limited to, any one of a polymer, an OCA (optical clear adhesive), a polymer organic compound material that enables thermal hardening or UV hardening, SiOx, SiNx, and polyimide, wherein SiOx, SiNx and polyimide are based on a transparent inorganic based material. Also, the passivation film may be a transparent plastic or a transparent substrate, such as PET (polyethylene terephthalate) or PMMA (poly(methyl methacrylate)) if higher strength is required depending on a use environment of the transparent display device. Moreover, the passivation film may have a refractive index of 1.3 to 1.9 for refractive index matching.

Also, an adhesive layer may further be provided for coupling between the light controlling apparatus 1000 and the transparent display panel 1100. The adhesive layer is arranged between the second electrode 140 of the light controlling apparatus 1000 and the lower substrate 1101 of the transparent display panel 1100. For example, the adhesive layer may be an adhesive film such as an OCA (optical clear adhesive) which is one of optical transparent adhesives. In this case, after the adhesive layer is attached to the second electrode 140 of the light controlling apparatus 1000 or the rear surface of the lower substrate 1101 of the transparent display panel 1100, the light controlling apparatus 1000 and the transparent display panel 1100 may be coupled with each other through a lamination process. The OCA used as the adhesive layer may have a refractive index between 1.4 and 1.9.

As described above, in the embodiment of the present invention, the lower substrate 1101 or the upper substrate 1102 of the transparent display panel 1100 is also used as the substrate of the light controlling apparatus 1000. That is, the transparent display panel 1100 and the light controlling apparatus 1000 use the substrate in common. Therefore, in the embodiment of the present invention, since the substrate may be reduced, the thickness of the transparent display device may be reduced, whereby transparency may be increased.

Figure 18:
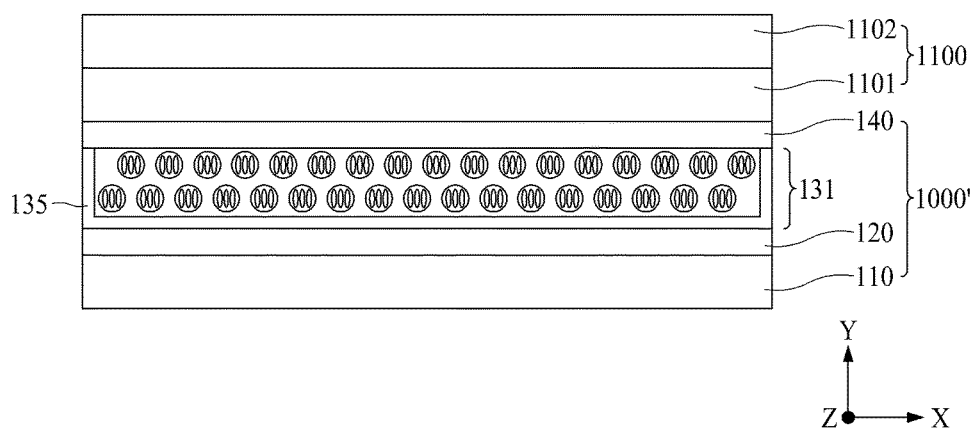
FIG. 18 is a cross-sectional view illustrating a transparent display device according to another embodiment of the present invention.

FIG. 18 is a cross-sectional view illustrating a transparent display device according to other embodiment of the present invention. With reference to FIG. 18, the transparent display device includes a light controlling apparatus 1000' and a transparent display panel 1100.

Although the section of the transparent display panel 1100 may be substantially the same as that of the bottom emission type shown in FIG. 15A or that of the top emission type shown in FIG. 15B, the lower substrate 1101 and the upper substrate 1102 are shown in FIG. 18 for convenience of description. If the transparent display panel 1100 is formed in a top emission type as shown in FIG. 15B, light of the transparent display panel 1100 is emitted toward the upper substrate 1102, whereby the light controlling apparatus 1000' may be arranged below the lower substrate 1101 as shown in FIG. 18. Also, if the transparent display panel 1100 is formed in a bottom emission type as shown in FIG. 15A, light of the transparent display panel 1100 is emitted toward the lower substrate 1101, whereby the light controlling apparatus 1000' may be arranged on the upper substrate 1102.

The light controlling apparatus 1000' may include a first substrate 110, a first electrode 120, a PDLC layer 131, and a second electrode 140 as shown in FIG. 18. That is, FIG. 18 exemplarily illustrates that the light controlling apparatus 1000' include a single liquid crystal layer. Although FIG. 18 exemplarily illustrates that the single liquid crystal layer is the PDLC layer 131, a polymer network liquid crystal layer or a cholesteric liquid crystal layer may be used as the single liquid crystal layer without limitation to the example of FIG. 18.

The first substrate 110, the first electrode 120, the PDLC layer 131 and the second electrode 140 of the light controlling apparatus 1000' shown in FIG. 18 are substantially the same as those described with reference to FIG. 2 except that the second electrode 140 is formed on the lower substrate 1101 of the transparent display panel 1100 not the second substrate. Also, if the transparent display panel 1100 is formed in a bottom emission type as shown in FIG. 15A, the second electrode 140 of the light controlling apparatus 1000' may be formed on the upper substrate 1102 of the transparent display panel 1100 not the second substrate.

Meanwhile, in the embodiment of the present invention, a passivation film 135 for surrounding a side of the PDLC layer 131 or a side and a lower surface of the PDLC layer 131 may be provided. The lower surface of the PDLC layer 131 represents one surface of the PDLC layer 131, which is in contact with the first electrode 120. Also, the passivation film 135 may serve to passivate the first electrode 120 as well as the PDLC layer 131. The passivation film 135 may be made of a transparent inorganic material that has certain strength and at the same may transmit external light. The passivation film 135 may be made of, but not limited to, any one of a polymer, an OCA (optical clear adhesive), a polymer organic compound material that enables thermal hardening or UV hardening, SiOx, SiNx, and polyimide, wherein SiOx, SiNx and polyimide are based on a transparent inorganic based material. Also, the passivation film 135 may be a transparent plastic or a transparent substrate, such as PET (polyethylene terephthalate) or PMMA (poly(methyl methacrylate)) if higher strength is required depending on a use environment of the transparent display device.

Moreover, the passivation film 135 may have a refractive index of 1.3 to 1.8 to prevent Fresnel reflection from occurring due to a difference in a refractive index between the first electrode 120 and the PDLC layer 131. For example, since the first electrode 120 may have a refractive index between 1.6 and 1.8 and the PDLC layer 131 may have a refractive index between 1.3 and 1.6, if the passivation film 135 has a refractive index between 1.3 and 1.8 between the refractive indexes of the first electrode 120 and the PDLC layer 131, Fresnel reflection may be prevented from occurring due to the difference in a refractive index between the first electrode 120 and the PDLC layer 131.

Also, if the light controlling apparatus 1000' does not include the passivation film 135, short that may occur in the light controlling apparatus may be avoided. For example, if a pressure is physically given to the light controlling apparatus 1000', the first electrode 120 and the second electrode 140 are in contact with each other, whereby short may occur in the light controlling apparatus 1000'. Also, fine particles may be mixed with the PDLC layer 131 during the process of fabricating the light controlling apparatus 1000'. The fine particles serve as a conductor that enables electric connection between the first electrode 120 and the second electrode 140 in the PDLC layer 131, whereby short may occur in the light controlling apparatus 1000'. However, since the passivation film 135 is made of the aforementioned material, the passivation film 135 may serve as an insulator. Therefore, the passivation film 135 may prevent short from occurring in the light controlling apparatus 1000', whereby reliability of the light controlling apparatus may be improved.

Moreover, a refractive index matching layer may be provided between the second electrode 140 and the lower substrate 1101 to reduce a difference in a refractive index between the second electrode 140 and the lower substrate 1101. Also, a refractive index matching layer may be provided between the second electrode 140 and the PDLC layer 131 to reduce a difference in a refractive index between the second electrode 140 and the PDLC layer 131.

Also, an adhesive layer may further be provided for coupling between the light controlling apparatus 1000' and the transparent display panel 1100. The adhesive layer is arranged between the second electrode 140 of the light controlling apparatus 1000' and the lower substrate 1101 of the transparent display panel 1100. For example, the adhesive layer may be an adhesive film such as an OCA (optical clear adhesive) which is one of optical transparent adhesives. After the adhesive layer is attached to the second electrode 140 of the light controlling apparatus 1000' or the rear surface of the lower substrate 1101 of the transparent display panel 1100, the light controlling apparatus 1000' and the transparent display panel 1100 may be coupled with each other through a lamination process. As described above, in the embodiment of the present invention, the lower substrate 1101 or the upper substrate 1102 of the transparent display panel 1100 is also used as the substrate of the light controlling apparatus 1000'. That is, the transparent display panel 1100 and the light controlling apparatus 1000' use the substrate in common. Therefore, in the embodiment of the present invention, since the substrate may be reduced, the thickness of the transparent display device may be reduced, whereby transparency may be increased.

As described above, in accordance with the present invention, advantages may be obtained.

For example, as the plurality of liquid crystal layers that include a PDLC layer and a GHLC layer are provided, the transmittance ratio may be more increased in the transparent mode and the light shielding ratio may be increased in the light shielding mode than a case where a single liquid crystal layer is provided. Also, in the present invention, as the plurality of liquid crystal layers that include a PDLC layer and a GHLC layer are provided, the amount of the dichroic dyes may be reduced, whereby the transmittance ratio may be increased in the transparent mode.

Also, as the plurality of liquid crystal layers that include a PDLC layer and a GHLC layer are provided, the path of light scattered in the light shielding mode become long. Therefore, light absorption of the dichroic dyes is increased, whereby the light shielding ratio may be increased in the light shielding mode.

Also, as a specific color is displayed in accordance with the dichroic dyes of the GHLC Layer, a rear background of the light controlling apparatus may not be seen in the light shielding mode, whereby esthetic effect in addition to the light shielding function may be provided to the user.

Also, as the transparent mode may be provided without applying any voltage, it is advantageous in that separate power consumption is not required for the transparent mode.

Also, as the first alignment film and the second alignment film are attached to each other on the dams of the wall of the GHLC layer, the problem that the GHLC layer is vulnerable to external pressure may be solved.

Also, as the liquid crystal material is not injected between the first substrate and the second substrate but coated or formed on the substrate and hardened using UV, the fabricating process may be simplified, whereby the fabricating cost may be reduced.

Also, if the light controlling apparatus is realized in the light shielding mode shielding light upon the rear surface of the transparent display panel in the display mode in which pixels of the transparent display panel display an image, quality of the image displayed by the transparent display panel may be improved.

Also, as the dams of the wall of the GHLC layer are provided in the emissive area of the transparent display panel, their areas are increased to a maximum range if possible, whereby the adhesive force between the first alignment film and the second alignment film may be increased.

Also, the lower substrate or the upper substrate of the transparent display panel is used as the substrate of the light controlling apparatus. That is, the transparent display panel and the light controlling apparatus use the substrate in common. Therefore, in the embodiment of the present invention, since the substrate may be reduced, the thickness of the transparent display device may be reduced, whereby the transmittance ratio may be increased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A light controlling apparatus, comprising:
   first and second substrates facing each other;
   a first electrode on the first substrate;
   a second electrode on the second substrate;
   a plurality of liquid crystal layers between the first electrode and the second electrode, the plurality of liquid crystal layers comprising:
      a polymer dispersed liquid crystal (PDLC) layer including first liquid crystals having droplets dispersed in a polymer, and
      a guest-host liquid crystal (GHLC) layer including second liquid crystals, dichroic dyes, and a wall having concavo-convex shape;
   a first alignment film covering the wall; and
   a second alignment film including an adhesive material,
   wherein the first and second alignment films are attached to each other for encompassing the second liquid crystals and the dichroic dyes
   wherein the GHLC layer is on the PDLC layer such that the wall directly contacts the polymer.

2. The light controlling apparatus of claim 1, wherein the wall has dams and a plurality of liquid crystal areas between the dams, and the first and second alignment films are attached to each other on upper surfaces of the dams.

3. The light controlling apparatus of claim 2, wherein the second liquid crystals and the dichroic dyes are disposed in the plurality of liquid crystal areas, and the first and second alignment films seal the plurality of liquid crystal areas.

4. The light controlling apparatus of claim 3, wherein a difference in ratios of the second liquid crystals to the dichroic dyes between the plurality of liquid crystal areas is similar within 1%.

5. The light controlling apparatus of claim 3, wherein the first alignment film is configured to arrange the second liquid crystals and the dichroic dyes.

6. The light controlling apparatus of claim 3, wherein the PDLC layer and the GHLC layer are realized in a transparent mode for transmitting incident light when no voltage is applied to the first and second electrodes or when a voltage difference between a first voltage applied to the first electrode and a second voltage applied to the second electrode is smaller than a first reference voltage.

7. The light controlling apparatus of claim 3, wherein the first liquid crystals, the second liquid crystals and the dichroic dyes are arranged in a vertical direction when no voltage is applied to the first and second electrodes or when a voltage difference between a first voltage applied to the first electrode and a second voltage applied to the second electrode is smaller than a first reference voltage.

8. The light controlling apparatus of claim 3, wherein the PDLC layer and the GHLC layer are realized in a light shielding mode for shielding incident light when a voltage difference between a first voltage applied to the first electrode and a second voltage applied to the second electrode is greater than a second reference voltage.

9. The light controlling apparatus of claim 3, wherein the first liquid crystals, the second liquid crystals and the dichroic dyes are arranged in a horizontal direction when a voltage difference between a first voltage applied to the first electrode and a second voltage applied to the second electrode is greater than a second reference voltage.

10. The light controlling apparatus of claim 1, further comprising:
a first refractive index matching layer on an opposite surface of one surface of the first substrate having the first electrode, the first refractive index matching layer having a refractive index between a refractive index of the first substrate and a refractive index of the air; and
a second refractive index matching layer on an opposite surface of one surface of the second substrate having the second electrode, the second refractive index matching layer having a refractive index between a refractive index of the second substrate and a refractive index of the air.

11. The light controlling apparatus of claim 1, further comprising:
a first refractive index matching layer between the first substrate and the first electrode, the first refractive index matching layer having a refractive index between a refractive index of the first substrate and a refractive index of the first electrode; and
a second refractive index matching layer between the second substrate and the second electrode, the second refractive index matching layer having a refractive index between a refractive index of the second substrate and a refractive index of the second electrode.

12. The light controlling apparatus of claim 1, further comprising:
a first refractive index matching layer between the first electrode and the PDLC layer, the first refractive index matching layer having a refractive index between a refractive index of the first electrode and a refractive index of the PDLC layer; and
a second refractive index matching layer between the second electrode and the GHLC layer, the second refractive index matching layer having a refractive index between a refractive index of the second electrode and a refractive index of the GHLC layer.

13. A transparent display device, comprising:
a transparent display panel including a transmissive area and an emissive area, the emissive area having pixels displaying an image; and
a light controlling apparatus on one surface of the transparent display panel,
wherein the light controlling apparatus includes:
first and second substrates facing each other;
a first electrode on the first substrate;
a second electrode on the second substrate;
a plurality of liquid crystal layers between the first electrode and the second electrode, the plurality of liquid crystal layers comprising a polymer dispersed liquid crystal (PDLC) layer including first liquid crystals having droplets dispersed in a polymer, and a guest-host liquid crystal (GHLC) layer including second liquid crystals, dichroic dyes, a wall having dams, and a plurality of liquid crystal areas between the dams;
a first alignment film covering the dams and the plurality of liquid crystal area; and
a second alignment film including an adhesive material,
wherein the first and second alignment films are attached to each other on convex surfaces the dams for sealing the plurality of liquid crystal areas encompassing the second liquid crystals and the dichroic dyes,
the PDLC layer and the GHLC layer have a transparent mode for transmitting incident light if no voltage is applied, and have a light shielding mode for shielding incident light if a voltage is applied, and
the PDLC layer and the GHLC layer have the light shielding mode in a display mode in which pixels of the transparent display panel display an image, and have the transparent mode or the light shielding mode in a non-display mode in which the pixels do not display an image the dams of the wall correspond to the emissive area, and wherein the GHLC layer is directly on the PDLC layer such that the wall directly contacts the polymer.

14. The transparent display device of claim 13, wherein the first liquid crystals, the second liquid crystals and the dichroic dyes are arranged in a vertical direction if no voltage is applied, and are arranged in a horizontal direction if a voltage is applied.

15. The transparent display device of claim 13, wherein a difference in ratios of the second liquid crystals to the dichroic dyes between the plurality of liquid crystal areas is similar within 1%.

16. A transparent display device, comprising:
a transparent display panel including a lower substrate and an upper substrate; and
a light controlling apparatus below the lower substrate of the transparent display panel,
wherein the light controlling apparatus includes:
a first electrode on a first substrate;
a second electrode on the lower substrate or the upper substrate;
a plurality of liquid crystal layers including a polymer dispersed liquid crystal (PDLC) layer and a guest-host liquid crystal (GHLC) layer between the first electrode and the second electrode;

a first alignment film; and a second alignment film including an adhesive material;

wherein the PDLC layer includes first liquid crystals having droplets dispersed in a polymer, and the GHLC layer includes second liquid crystals, dichroic dyes and a wall having dams and a plurality of liquid crystal areas between the dams, wherein the GHLC layer is on the PDLC, wherein the first alignment film covers the dams and the plurality of liquid crystal areas, wherein the first and the second alignment films are attached to each other on convex surfaces of the dams for sealing the plurality of liquid crystal areas having the second liquid crystals and the dichroic dyes, and wherein the plurality of liquid crystal layers have a transparent mode for transmitting incident light if no voltage is applied, and have a light shielding mode for shielding incident light if a voltage is applied, and wherein the plurality of liquid crystals layers have the light shielding mode in a display mode in which pixels of the transparent display panel display an image, and have the transparent mode or the light shielding mode in a non-display mode in which the pixels do not display an image wherein the GHLC layer is directly on the PDLC layer such that the wall directly contacts the polymer.

17. The transparent display device of claim 14, wherein the transparent display panel is top emission type display panel emitting light toward an upper substrate.

* * * * *